(12) United States Patent
Takaike

(10) Patent No.: US 8,559,184 B2
(45) Date of Patent: Oct. 15, 2013

(54) ELECTRONIC COMPONENT BUILT-IN SUBSTRATE AND METHOD OF MANUFACTURING THE SAME

(75) Inventor: Eiji Takaike, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 448 days.

(21) Appl. No.: 12/635,066

(22) Filed: Dec. 10, 2009

(65) Prior Publication Data

US 2010/0149768 A1   Jun. 17, 2010

(30) Foreign Application Priority Data

Dec. 11, 2008   (JP) .................................. 2008-315513

(51) Int. Cl.
*H05K 1/18* (2006.01)
*H01L 23/538* (2006.01)

(52) U.S. Cl.
CPC .................................. *H01L 23/5383* (2013.01)
USPC .......................................... 361/761; 174/255

(58) Field of Classification Search
CPC .................................................. H01L 23/5383
USPC .......... 174/258, 262, 255; 361/760, 761, 762, 361/763, 764, 766; 438/106, 15, 25, 26
See application file for complete search history.

(56) References Cited

U.S. PATENT DOCUMENTS

| | | | | |
|---|---|---|---|---|
| 6,359,235 B1 * | 3/2002 | Hayashi | ......................... | 174/260 |
| 6,975,516 B2 * | 12/2005 | Asahi et al. | .................... | 361/761 |
| 7,394,663 B2 * | 7/2008 | Yamashita et al. | ............. | 361/766 |
| 2001/0015485 A1 * | 8/2001 | Song et al. | ..................... | 257/679 |
| 2005/0112798 A1 * | 5/2005 | Bjorbell | ......................... | 438/106 |
| 2008/0149384 A1 * | 6/2008 | Kawabe | .......................... | 174/265 |

FOREIGN PATENT DOCUMENTS

| | | |
|---|---|---|
| JP | 2005-142178 | 6/2005 |
| JP | 2006-156669 | 6/2006 |
| JP | 2007-173570 | 7/2007 |
| JP | 2008-205290 | 9/2008 |
| JP | 2008-294475 | 12/2008 |

* cited by examiner

*Primary Examiner* — Yuriy Semenenko
(74) *Attorney, Agent, or Firm* — Drinker Biddle & Reath LLP

(57) ABSTRACT

A first wiring substrate has a first wiring substrate main body and a first wiring pattern provided on a first surface of the first wiring substrate main body. A first electronic component is surface-mounted on the first wiring pattern. A second wiring substrate has a second wiring substrate main body and a second wiring pattern provided on a first surface of the second wiring substrate main body. The second wiring substrate is arranged under the first wiring substrate such that the first surface of the first wiring substrate main body opposes to the first surface of the second wiring substrate main body. A second electronic component is surface-mounted on the second wiring pattern, and arranged to oppose to the first electronic component. A resin member seals a space between the first wiring substrate and the second wiring substrate.

5 Claims, 34 Drawing Sheets

Related Art

Related Art

Related Art

Related Art

Related Art

Related Art

ELECTRONIC COMPONENT BUILT-IN SUBSTRATE AND METHOD OF MANUFACTURING THE SAME This application claims priority to Japanese Patent Application No. 2008-315513, filed Dec. 11, 2008, in the Japanese Patent Office. The Japanese Patent Application No. 2008-315513 is incorporated by reference in its entirety.

TECHNICAL FIELD

The present disclosure relates to an electronic component built-in substrate and a method of manufacturing the same. More particularly, the present disclosure relates to an electronic component built-in substrate in which a plurality of electronic components are built and a method of manufacturing the same.

RELATED ART

FIG. 1 is a sectional view of an electronic component built-in substrate in the related art.

By reference to FIG. 1, an electronic component built-in substrate 200 in the related art has a core substrate 201, through vias 202, 203, electronic component mounting pads 205, 208, pads 206, 209, 221, 231, electronic components 211, 214, underfill resins 212, 215, resin layers 217, 222, 228, 232, via 218, 229, 223, 234, and external connection pads 225, 235.

The through vias 202 are formed to pass through the core substrate 201. Upper ends of the through vias 202 are connected to the electronic component mounting pads 205 formed on an upper surface 201A of the core substrate 201 respectively, and lower ends of the through vias 202 are connected to the electronic component mounting pads 208 formed on a lower surface 201B of the core substrate 201 respectively.

The through vias 203 are formed to pass through the core substrate 201. Upper ends of the through vias 203 are connected to the pads 206 formed on the upper surface 201A of the core substrate 201 respectively, and lower ends of the through vias 203 are connected to the pads 209 formed on the lower surface 201B of the core substrate 201 respectively.

The electronic component mounting pads 205 are provided on the upper surface 201A of the core substrate 201, and are connected to the through vias 202. The electronic component mounting pads 208 are provided on the lower surface 201B of the core substrate 201, and are connected to the through vias 202. The electronic component mounting pads 205, 208 are connected electrically mutually via the through vias 202.

The pads 206 formed on the upper surface 201A of the core substrate 201. The pads 209 are formed on the lower surface 201B of the core substrate 201. The pads 209 are connected electrically to the pads 206 via the through vias 203.

The electronic component 211 is surface-mounted on the electronic component mounting pads 205. The underfill resin 212 is provided to fill a clearance between the electronic component 211 and the core substrate 201 on which the electronic component mounting pads 205 are formed.

The electronic component 214 is surface-mounted on the electronic component mounting pads 208. The underfill resin 215 is provided to fill a clearance between the electronic component 214 and the core substrate 201 on which the electronic component mounting pads 208 are formed.

The resin layer 217 is provided on the upper surface 201A of the core substrate 201 to over the electronic component 211. The vias 218 are provided to pass through portions of the resin layer 217 arranged on the pads 206. Lower ends of the vias 218 are connected to the pads 206. The pads 221 are provided on an upper surface 217A of the resin layer 217, and are connected to upper ends of the vias 218.

The resin layer 222 is provided on the upper surface 217A of the resin layer 217 to cover the pads 221. The vias 223 are provided to pass through portions of the resin layer 222 arranged on the pads 221. Lower ends of the vias 223 are connected to the pads 221. The external connection pads 225 are provided on an upper surface 222A of the resin layer 222, and are connected to upper ends of the vias 223.

The resin layer 228 is provided on the lower surface 201B of the core substrate 201 to cover the electronic component 214. The vias 229 are provided to pass through portions of the resin layer 228 opposing to the pads 209. Upper ends of the vias 229 are connected to the pads 209 respectively. The pads 231 are provided on a lower surface 228A of the resin layer 228, and are connected to lower ends of the vias 229.

The resin layer 232 is provided on the lower surface 228A of the resin layer 228 to cover the pads 231. The vias 234 are provided to pass through portions of the resin layer 232 opposing to the pads 231. Upper ends of the vias 234 are connected to the pads 231 respectively. The external connection pads 235 are provided on a lower surface 232A of the resin layer 232, and are connected to lower ends of the vias 234.

FIG. 2 to FIG. 7 are views showing steps of manufacturing the electronic component built-in substrate in the related art. In FIG. 2 to FIG. 7, the same references are affixed to the same constituent portions as those in the electronic component built-in substrate 200 in the related art.

By reference to FIG. 2 to FIG. 7, a method of manufacturing the electronic component built-in substrate 200 in the related art will be explained hereunder. At first, in steps shown in FIG. 2, the through vias 202, 203, the electronic component mounting pads 205, 208, and the pads 206, 209 are formed on the core substrate 201 by the well-known approach.

Then, in steps shown in FIG. 3, the electronic component 211 is surface-mounted on the electronic component mounting pads 205. Then, the underfill resin 212 for filling a clearance between the core substrate 201 and the electronic component 211 is formed.

Then, in steps shown in FIG. 4, the resin layer 217 for covering the electronic component 211 is formed on the upper surface side of the structure shown in FIG. 3. Concretely, the resin layer 217 is formed by pasting a resin film, which is kept in a semi-cured state, on the upper surface side of the structure shown in FIG. 3, and then heating the overall structure shown in FIG. 4 to cure the resin film completely.

Then, in steps shown in FIG. 5, the electronic component 214 is surface-mounted on the electronic component mounting pads 208. Then, the underfill resin 215 for filling a clearance between the core substrate 201 and the electronic component 214 is formed.

Then, in steps shown in FIG. 6, the resin layer 228 for covering the electronic component 214 is formed on the lower surface side of the structure shown in FIG. 5. Concretely, the resin layer 228 is formed by pasting a resin film, which is kept in a semi-cured state, on the lower surface side of the structure shown in FIG. 5, and then heating the overall structure shown in FIG. 5 to cure the resin film completely.

Then, in steps shown in FIG. 7, the pads 221, 231, the resin layers 217, 222, 228, 232, the vias 218, 229, 223, 234, and the external connection pads 225, 235 are formed by the build-up method. Accordingly, the electronic component built-in substrate 200 in the related art is manufactured (see Patent Literature 1, for example).

[Patent Literature 1] JP-A-2008-205290

However, in the electronic component built-in substrate 200 in the related art, the core substrate 201 for mounting the electronic components 211, 214 thereon is needed in the center portion of the electronic component built-in substrate 200. Therefore, such a problem existed that it is difficult to reduce a size of the electronic component built-in substrate 200 in a thickness direction.

Also, in the method of manufacturing the electronic component built-in substrate in the related art, in the steps shown in FIG. 4, the resin film being kept in a semi-cured state until now is completely cured by heating the overall structure shown in FIG. 4 in a state that the structure formed on the upper surface 201A of the core substrate 201 and the structure formed on the lower surface 201B side of the core substrate 201 are set in a asymmetrical state, so that the resin layer 217 is formed. Therefore, such a problem existed that a warp of the structure shown in FIG. 4 is caused and this warp still remains in the electronic component built-in substrate 200.

SUMMARY

Exemplary embodiments of the present invention provide an electronic component built-in substrate, capable of reducing a size in a thickness direction of the electronic component built-in substrate, and a method of manufacturing the same, capable of not also reducing a size in a thickness direction of the electronic component built-in substrate but also preventing occurrence of a warp in manufacturing the electronic component built-in substrate.

An electronic component built-in substrate according to a first aspect of the invention, comprises:

a first wiring substrate having a first wiring substrate main body and a first wiring pattern provided on a first surface of the first wiring substrate main body;

a first electronic component surface-mounted on the first wiring pattern;

a second wiring substrate having a second wiring substrate main body and a second wiring pattern provided on a first surface of the second wiring substrate main body, the second wiring substrate being arranged under the first wiring substrate such that the first surface of the first wiring substrate main body opposes to the first surface of the second wiring substrate main body;

a second electronic component surface-mounted on the second wiring pattern, and arranged to oppose to the first electronic component; and a resin member for sealing a space between the first wiring substrate to which the first electronic component is connected, and the second wiring substrate to which the second electronic component is connected.

The electronic component built-in substrate, comprises a first wiring substrate having a first wiring substrate main body and a first wiring pattern provided on a first surface of the first wiring substrate main body, a first electronic component surface-mounted on the first wiring pattern, a second wiring substrate having a second wiring substrate main body and a second wiring pattern provided on a first surface of the second wiring substrate main body, the second wiring substrate being arranged under the first wiring substrate such that the first surface of the first wiring substrate main body opposes to the first surface of the second wiring substrate main body, a second electronic component surface-mounted on the second wiring pattern, and arranged to oppose to the first electronic component, and a resin member for sealing a space between the first wiring substrate to which the first electronic component is connected, and the second wiring substrate to which the second electronic component is connected.

Therefore, a size of the electronic component built-in substrate in the thickness direction can be reduced rather than the related-art electronic component built-in substrate in which the electronic components being mounted on both surfaces of the core substrate are built.

A method of manufacturing an electronic component built-in substrate according to a second aspect of the invention, comprises:

a first wiring substrate forming step of forming a first wiring substrate that has a first wiring substrate main body and a first wiring pattern being provided on a first surface of the wiring substrate main body;

a first electronic component mounting step of surface-mounting a first electronic component on the first wiring pattern;

a second wiring substrate forming step of forming a second wiring substrate that has a second wiring substrate main body and a second wiring pattern being provided on a first surface of the second wiring substrate main body;

a second electronic component mounting step of surface-mounting a second electronic component on the second wiring pattern;

a resin member forming step of forming a resin member which is shaped like a plate, which has a first through portion in which the first and second electronic components are contained, and which is kept in a semi-cured state;

a stacked body forming step of forming a stacked body, in which the first wiring substrate on which the first electronic component is surface-mounted, the resin member that is kept in a semi-cured state, and the second wiring substrate on which the second electronic component is surface-mounted are stacked, by inserting the first electronic component being surface-mounted on the first wiring substrate and the second electronic component being surface-mounted on the second wiring substrate into the first through portion such that the first electronic component and the second electronic component are arranged to oppose to each other; and a sealing step of sealing a space between the first wiring substrate on which the first electronic component is surface-mounted and the second wiring substrate on which the second electronic component is surface-mounted, by pressing the stacked body that is in a heated state to cure completely the resin member that is kept in a semi-cured state.

The method of manufacturing an electronic component built-in substrate, comprises a first wiring substrate forming step of forming a first wiring substrate that has a first wiring substrate main body and a first wiring pattern being provided on a first surface of the wiring substrate main body, a first electronic component mounting step of surface-mounting a first electronic component on the first wiring pattern, a second wiring substrate forming step of forming a second wiring substrate that has a second wiring substrate main body and a second wiring pattern being provided on a first surface of the second wiring substrate main body, a second electronic component mounting step of surface-mounting a second electronic component on the second wiring pattern, a resin member forming step of forming a resin member which is shaped like a plate, which has a first through portion in which the first and second electronic components are contained, and which is kept in a semi-cured state, a stacked body forming step of forming a stacked body, in which the first wiring substrate on which the first electronic component is surface-mounted, the resin member that is kept in a semi-cured state, and the second wiring substrate on which the second electronic component is surface-mounted are stacked, by inserting the first electronic component being surface-mounted on the first wiring substrate and the second electronic component being surface-mounted on the second wiring substrate into the first through portion such that the first electronic component and the second electronic component are arranged to oppose to each other, and a sealing step of sealing a space between the first wiring substrate on which the first electronic component is surface-mounted and the second wiring substrate on which the second electronic component is surface-mounted, by pressing the stacked body that is in a heated state to cure completely the resin member that is kept in a semi-cured state.

Therefore, a size of the electronic component built-in substrate in the thickness direction can be reduced rather than the related-art electronic component built-in substrate in which the electronic components being mounted on both surfaces of the core substrate are built.

Also, the resin member that is kept in a semi-cured state is fully cured by the heating in such a state that the first wiring substrate, on which the first electronic component is surface-mounted, is arranged on the surface of the resin member that is kept in a semi-cured state and also the second wiring substrate, on which the second electronic component is surface-mounted, is arranged on the surface of the resin member that is kept in a semi-cured state (a state that the structures having the similar configuration respectively are arranged on both surfaces of the resin member that is kept in a semi-cured state) such that the space between the first wiring substrate on which the first electronic component is surface-mounted and the second wiring substrate on which the second electronic component is surface-mounted is sealed. As a result, occurrence of a warp of the electronic component built-in substrate can be prevented.

According to the invention, a size in a thickness direction of the electronic component built-in substrate can be reduced, and occurrence of a warp in manufacturing the electronic component built-in substrate can be prevented.

Other features and advantages may be apparent from the following detailed description, the accompanying drawings and the claims.

DETAILED DESCRIPTION

Next, embodiments of the present invention will be explained with reference to the drawings hereinafter.

First Embodiment

Figure 8:
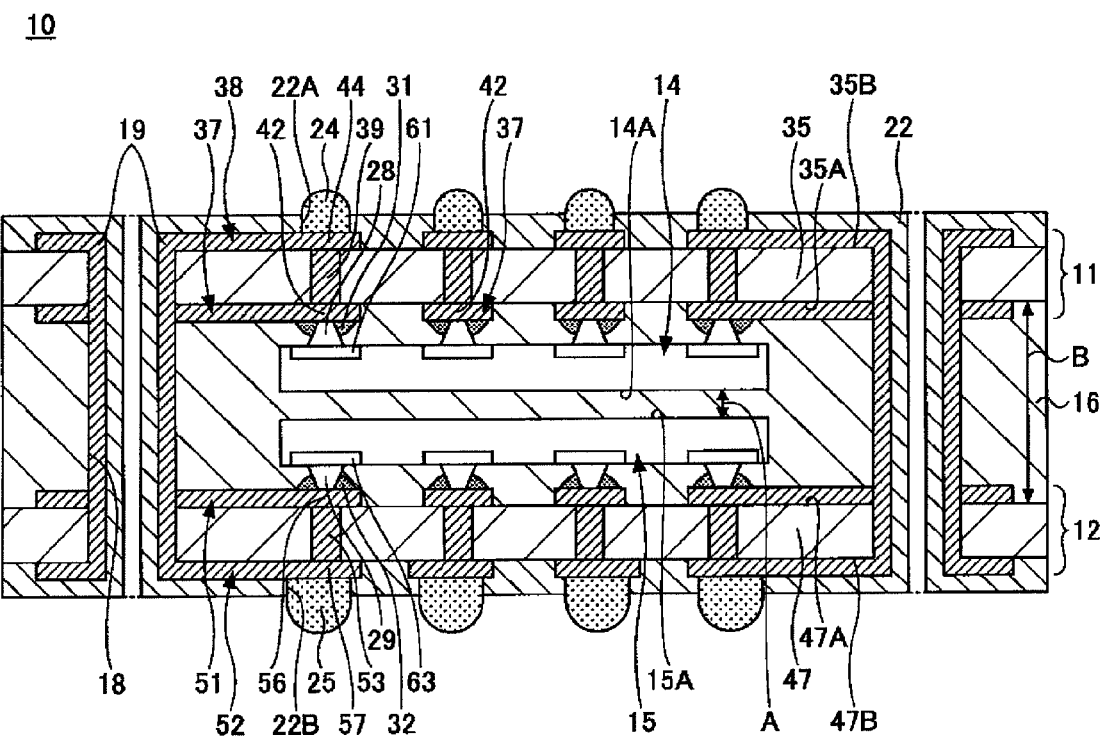
FIG. 8 is a sectional view of an electronic component built-in substrate according to a first embodiment of the present invention.

FIG. 8 is a sectional view of an electronic component built-in substrate according to a first embodiment of the present invention.

By reference to FIG. 8, an electronic component built-in substrate 10 of the first embodiment includes a first wiring substrate 11, a second wiring substrate 12, a first electronic component 14, a second electronic component 15, a resin member 16, through holes 18, through electrodes 19, a solder resist layer 22, first external connection terminals 24, and second external connection terminals 25.

The first wiring substrate 11 has a wiring substrate main body 35 as a first wiring substrate main body, wiring patterns 37 as first wiring patterns, wiring patterns 38 as third wiring patterns, and wiring patterns 39. As the wiring substrate main body 35, for example, the resin layer, the coreless substrate (multilayer wiring structure having a plurality of stacked resin layers and wiring patterns provided on a plurality of resin layers), the build-up substrate with core (substrate constructed by forming on a plurality of resin layers and wiring patterns on a core substrate), etc. may be employed.

The wiring patterns 37 are provided on a surface 35A (first surface) of the wiring substrate main body 35. The wiring patterns 37 have a pad portion 42 respectively. The pad portions 42 are connected to one end portions of the wiring patterns 39, bumps 28 connected electrically to the electronic component 14, and the through electrodes 19. Accordingly, the wiring patterns 37 connect electrically the through electrodes 19 and the electronic component 14. As the material of the wiring patterns 37, for example, Cu can be employed.

The wiring patterns 38 are provided on a surface 35B (second surface) of the wiring substrate main body 35, which is positioned on the opposite side to the surface 35A of the wiring substrate main body 35. The wiring patterns 38 have pad portions 44 respectively. The pad portions 44 are connected to other end portions of the wiring patterns 39 and the through electrodes 19, and also the first external connection terminal 24 is provided on the pad portions 44 respectively. As the material of the wiring pattern 38, for example, Cu can be employed.

The wiring patterns 39 are provided to pass through the wiring substrate main body 35. One end portions of the wiring patterns 39 are connected to the pad portions 42 respectively, and other end portions of the wiring patterns 39 are connected to the pad portions 44 respectively. Accordingly, the wiring patterns 39 connect electrically the wiring patterns 37 and the wiring patterns 38 respectively. As the wiring patterns 39, for example, a plurality of vias, wirings, and the like can be employed. As the material of the wiring pattern 39, for example, Cu can be employed.

The second wiring substrate 12 has a wiring substrate main body 47 as a second wiring substrate main body, wiring patterns 51 as second wiring patterns, wiring patterns 52 as fourth wiring patterns, and wiring patterns 53. The second wiring substrate 12 is arranged under the first wiring substrate 11 such that a surface 47A (first surface) of the wiring substrate main body 47 is opposed to the surface 35A of the wiring substrate main body 35.

As the wiring substrate main body 47, for example, the resin layer, the coreless substrate (multilayer wiring structure having a plurality of stacked resin layers and wiring patterns provided on a plurality of resin layers), the build-up substrate with core (substrate constructed by forming on a plurality of resin layers and wiring patterns on a core substrate), etc. may be employed.

The wiring patterns 51 are provided on the surface 47A (first surface) of the wiring substrate main body 47. The wiring patterns 51 have a pad portion 56 respectively. The pad portions 56 are connected electrically to one end portions of the wiring patterns 53, bumps 29 connected electrically to the electronic component 15, and the through electrodes 19. Accordingly, the wiring patterns 51 connect electrically the through electrodes 19 and the electronic component 15. As the material of the wiring pattern 51, for example, Cu can be employed.

The wiring patterns 52 are provided on a surface 47B (second surface) of the wiring substrate main body 47, which is positioned on the opposite side to the surface 47A of the wiring substrate main body 47. The wiring patterns 52 have a pad portion 57 respectively. The pad portions 57 are connected to other end portions of the wiring patterns 53 and the through electrodes 19, and also the second external connection terminal 25 is provided on the pad portions 57 respectively. As the material of the wiring pattern 52, for example, Cu can be employed.

The wiring patterns 53 are provided to pass through the wiring substrate main body 47. One end portions of the wiring patterns 53 are connected to the pad portions 56 respectively, and other end portions of the wiring patterns 53 are connected to the pad portions 57 respectively. Accordingly, the wiring patterns 53 connect electrically the wiring patterns 51 and the wiring patterns 52 respectively. As the wiring patterns 53, for example, a plurality of vias, wirings, and the like can be employed. As the material of the wiring pattern 39, for example, Cu can be employed.

The first electronic component 14 is surface-mounted on the pad portions 42 constituting the wiring patterns 37. Concretely, the first electronic component 14 is connected electrically to the pad portions 42 via the bumps 28 (e.g., Au bumps) provided to electrode pads 61 (one of constituent elements of the first electronic component 14). The bump 28 is fixed to the pad portions 42 by a solder 31 respectively. The first electronic component 14 is arranged between the first wiring substrate 11 and the second wiring substrate 12. The first electronic component 14 is sealed with the resin member 16. Also, the resin member 16 is filled into a clearance between the first electronic component 14 and the first wiring substrate 11. As the first electronic component 14, for example, a semiconductor chip, a chip resistor, a chip capacitor, or the like can be employed.

The second electronic component 15 is surface-mounted on the pad portions 56 constituting the wiring patterns 51. Concretely, the second electronic component 15 is connected electrically to the pad portions 56 via the bumps 29 (e.g., Au bumps) provided to electrode pads 63 (one of constituent elements of the second electronic component 15). The bump 29 is fixed to the pad portions 56 by a solder 32 respectively. An area of a surface 15A of the second electronic component 15 (surface of the portion of the second electronic component 15 opposing to the first electronic component 14) is set substantially equal in size to an area of a surface 14A of the first electronic component 14 (surface of the portion of the first electronic component 14 opposing to the second electronic component 15).

The second electronic component 15 is arranged between the first wiring substrate 11 and the second wiring substrate 12 such that this second electronic component 15 opposes to the first electronic component 14 mounted on the first wiring substrate 11. A clearance A is formed between the second electronic component 15 and the first electronic component 14. The second electronic component 15 is sealed with the resin member 16. Also, the resin member 16 is filled in a clearance between the second electronic component 15 and the second wiring substrate 12 and the clearance A between the first electronic component 14 and the second electronic component 15. This clearance A between the first electronic component 14 and the second electronic component 15 can be set to 10 μm for example. As the second electronic component 15, a semiconductor chip, a chip resistor, a chip capacitor, or the like can be employed.

Figure 1:
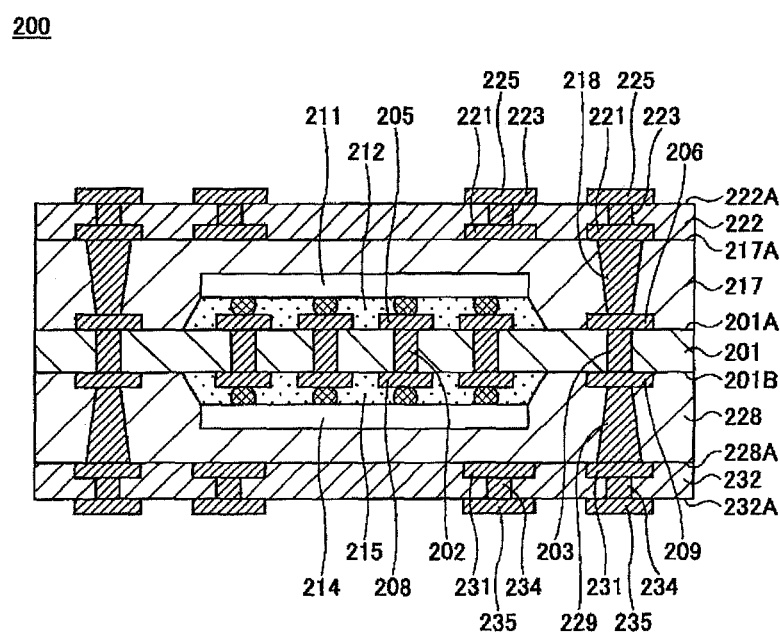
FIG. 1 is a sectional view of an electronic component built-in substrate in the related art.
Figure 2:
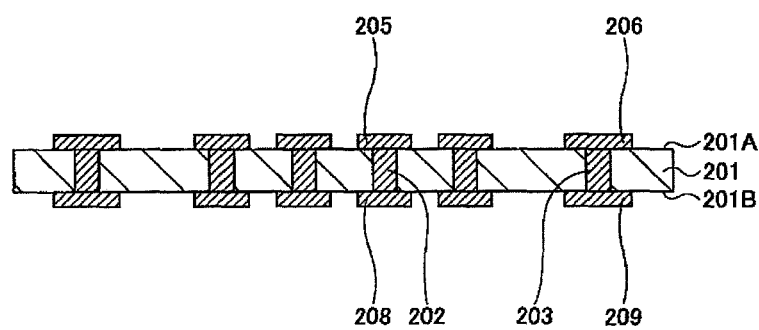
FIG. 2 to FIG. 7 are views showing steps of manufacturing the electronic component built-in substrate in the related art.
Figure 3:
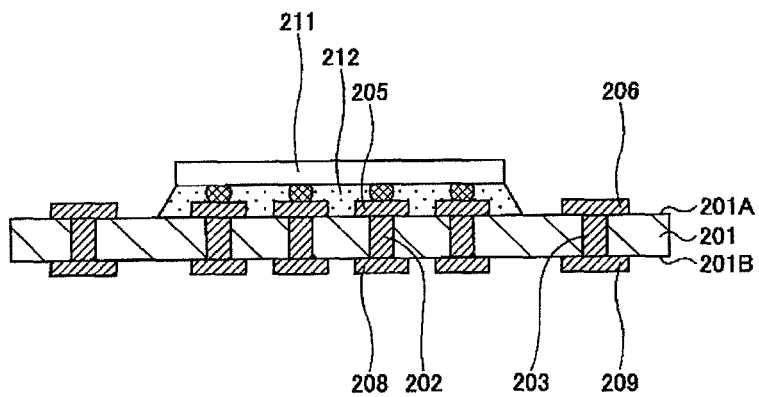
Figure 4:
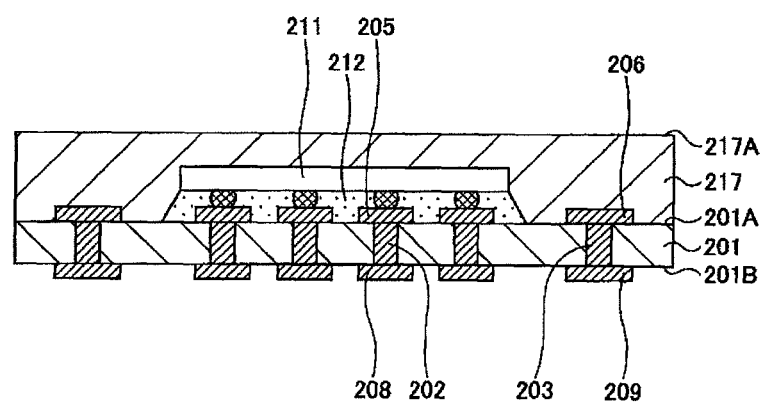
Figure 5:
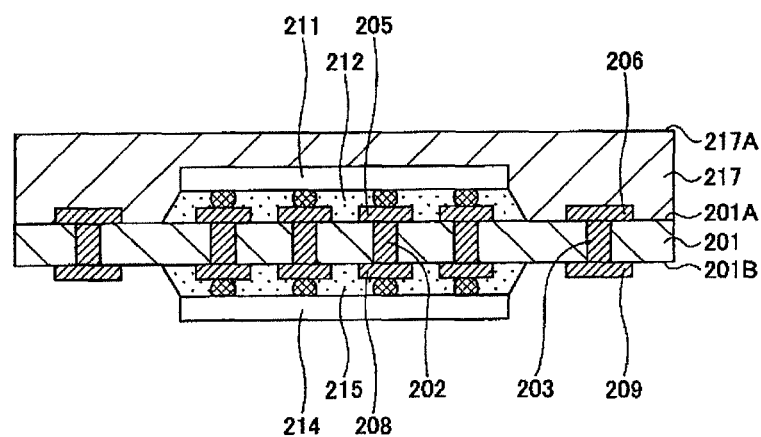
Figure 6:
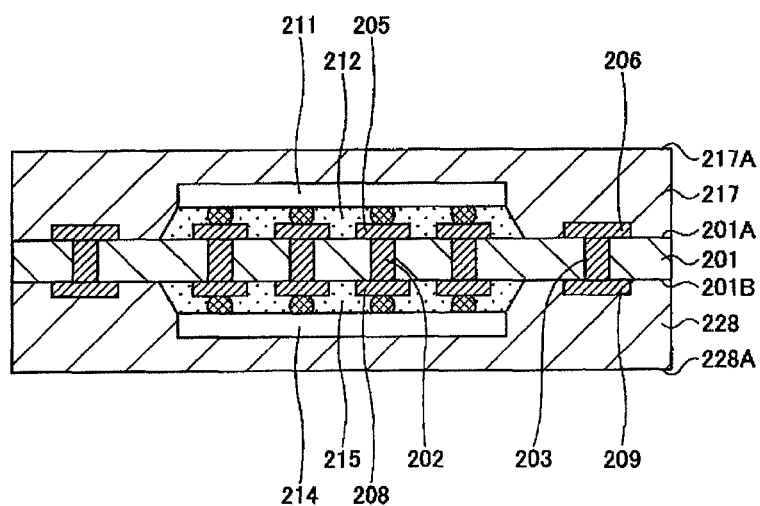
Figure 7:
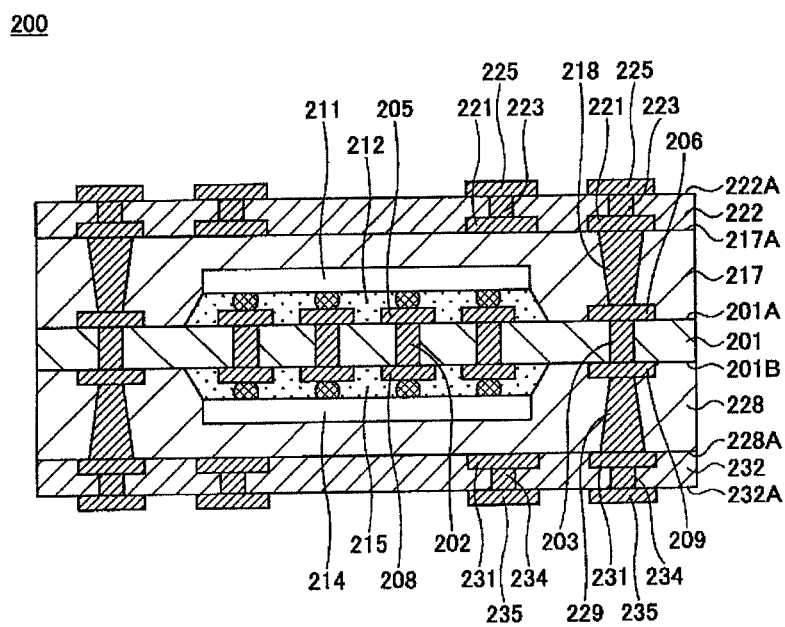

In this manner, a space between the first wiring substrate 11 and the second wiring substrate 12 being arranged to oppose to each other is sealed with the resin member 16 such that the first electronic component 14 surface-mounted on the first wiring substrate 11 and the second electronic component 15 surface-mounted on the second wiring substrate 12 are opposed to each other. Therefore, the core substrate 201 (see FIG. 1) needed as the substrate on which the electronic components 211, 214 are surface-mounted can be omitted. As a result, a size of the electronic component built-in substrate 10 in the thickness direction can be reduced.

The resin member 16 is the member obtained when the resin is completely cured, and is provided between the first wiring substrate 11 on which the first electronic component 14 is surface-mounted and the second wiring substrate 12 on which the second electronic component 15 is surface-mounted. The resin member 16 not only seals the space between the first wiring substrate 11 and the second wiring substrate 12 and the space between the first electronic component 14 and the second electronic component 15, but also integrates the first wiring substrate 11 on which the first electronic component 14 with the second wiring substrate 12 on which the second electronic component 15. The resin member 16 fills the clearance between the first electronic component 14 and the first wiring substrate 11, the clearance between the second electronic component 15 and the second wiring substrate 12, and the clearance A between the first electronic component 14 and the second electronic component 15. As the base material of the resin member 16, for example, a prepreg resin that has a first through portion 85 (see FIG. 16) in the portion corresponding to the provision areas of the first and second electronic components 14, 15 can be employed.

In this manner, when the prepreg resin is employed as the base material of the resin member 16, occurrence of a warp of the electronic component built-in substrate 10 can be prevented. A thickness B of the resin member 16 can be set to 300 µm, for example.

When the prepreg resin is employed as the base material of the resin member 16, only the resin contained in the prepreg resin is filled in the clearance between the first electronic component 14 and the first wiring substrate 11, the clearance between the second electronic component 15 and the second wiring substrate 12, and the clearance A between the first electronic component 14 and the second electronic component 15.

In this manner, only the resin is arranged in the clearance A between the first electronic component 14 and the second electronic component 15. Therefore, the clearance A between the first electronic component 14 and the second electronic component 15 can be made small (e.g., 10 µm). As a result, a size of the electronic component built-in substrate 10 in the thickness direction can be reduced.

The through holes 18 are formed to pass through the first wiring substrate 11, the second wiring substrate 12, and the resin member 16. The through holes 18 pierce through the wiring patterns 37, 38, 51, 52. Accordingly, the wiring patterns 37, 51 are exposed from the through holes 18. The through holes 18 can be formed by using the NC drill, for example.

The through electrode 19 is provided to cover the side surface of the through hole 18. The through electrodes 19 are connected to the wiring patterns 37, 38, 51, 52. The through electrode 19 is formed like a cylindrical shape, and has a hollow portion in the inside. As the material of the through electrodes 19, for example, Cu can be employed. The through electrodes 19 can be formed by the plating method, for example.

The solder resist layer 22 is provided to cover the surfaces 35B, 47B of the wiring substrate main bodies 35, 47, the portion of the wiring pattern 38 except the pad portions 44, the portion of the wiring pattern 52 except the pad portions 57, and inner walls of the through electrodes 19. The solder resist layer 22 has opening portions 22A from which the pad portion 44 is exposed respectively, and opening portions 22B from which the pad portion 57 is exposed respectively.

The first external connection terminal 24 is provided on the portions of the pad portions 44 that are exposed the opening portions 22A, respectively. The first external connection terminals 24 are the terminals that are connected electrically to the semiconductor chip (not shown), for example. As the first external connection terminals 24, for example, the solder bumps can be employed.

The second external connection terminal 25 is provided on the portions of the pad portions 57 that are exposed the opening portions 22B, respectively. The second external connection terminals 25 are the terminals that are connected electrically to the mounting substrate (not shown) such as the motherboard, or the like, for example. As the second external connection terminals 25, for example, the solder balls can be employed.

According to the electronic component built-in substrate of the present embodiment, the first wiring substrate 11 having the wiring substrate main body 35 and the wiring patterns 37 provided on the surface 35A of the wiring substrate main body 35, the first electronic component 14 surface-mounted on the wiring patterns 37, the second wiring substrate 12 having the wiring substrate main body 47 and the wiring patterns 51 provided on the surface 47A of the wiring substrate main body 47, and arranged under the first wiring substrate 11 such that the surface 35A of the wiring substrate main body 35 and the surface 47A of the wiring substrate main body 47 are opposed to each other, the second electronic component 15 surface-mounted on the wiring patterns 51, and arranged to oppose to the first electronic component 14, and the resin member 16 for sealing the space between the first wiring substrate 11 on which the first electronic component 14 is surface-mounted and the second wiring substrate 12 on which the second electronic component 15 is surface-mounted are provided. As a result, a size of the electronic component built-in substrate 10 in the thickness direction can be reduced rather than the related-art electronic component built-in substrate 200 in which the electronic components 211, 214 being mounted on both surfaces 201A, 201B of the core substrate 201 are built.

Figure 9:
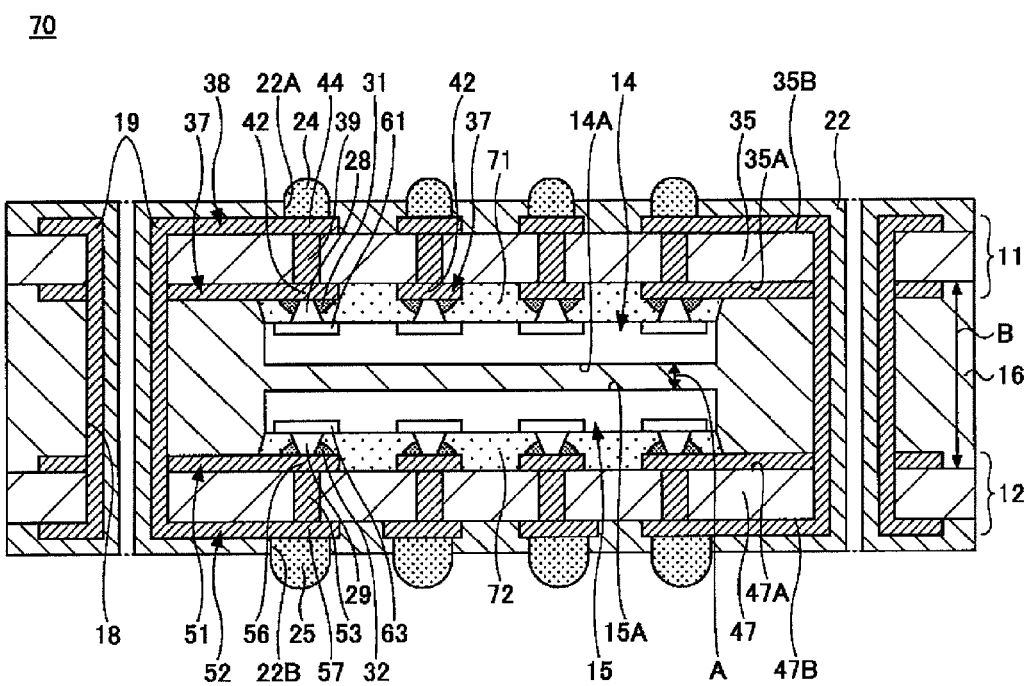
FIG. 9 is a sectional view of an electronic component built-in substrate according to a first variation of the first embodiment of the present invention.

FIG. 9 is a sectional view of an electronic component built-in substrate according to a first variation of the first embodiment of the present invention. In FIG. 9, the same symbols are affixed to the same constituent portions as those in the electronic component built-in substrate 10 of the first embodiment.

By reference to FIG. 9, an electronic component built-in substrate 70 according to the first variation of the first embodiment is constructed similarly to the electronic component built-in substrate 10 except that a first underfill resin 71 for filling a clearance between the first electronic component 14 and the first wiring substrate 11 and also a second underfill resin 72 for filling a clearance between the second electronic component 15 and the second wiring substrate 12 are further provided to the configuration of the electronic component built-in substrate 10 of the first embodiment.

In this manner, the first underfill resin 71 for filling the clearance between the first electronic component 14 and the first wiring substrate 11 and also the second underfill resin 72 for filling the clearance between the second electronic component 15 and the second wiring substrate 12 are further provided. Therefore, reliability of the electrical connection between the first electronic component 14 and the first wiring substrate 11, and also reliability of the electrical connection between the second electronic component 15 and the second wiring substrate 12 can be improved.

Also, the electronic component built-in substrate 70 according to the first variation of the first embodiment constructed as above can achieve the similar advantages to those in the electronic component built-in substrate 10 of the first embodiment.

Figure 10:
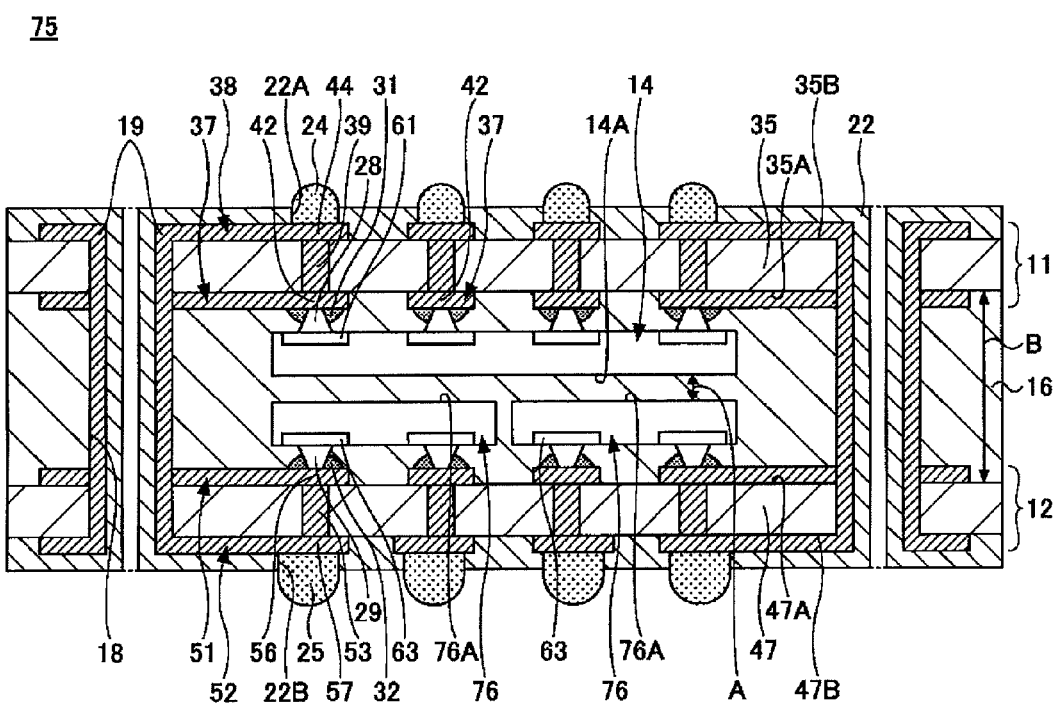
FIG. 10 is a sectional view of an electronic component built-in substrate according to a second variation of the first embodiment of the present invention.

FIG. 10 is a sectional view of an electronic component built-in substrate according to a second variation of the first embodiment of the present invention. In FIG. 10, the same symbols are affixed to the same constituent portions as those in the electronic component built-in substrate 10 of the first embodiment.

By reference to FIG. 10, an electronic component built-in substrate 75 according to a second variation of the first embodiment is constructed similarly to the electronic component built-in substrate 10 except that a plurality of second electronic components 76, an area of a surface 76A of each of which opposing to the surface 14A of the first electronic component 14 is smaller than an area of the surface 14A of the first electronic component 14, are provided instead of the second electronic component 15 being provided to the electronic component built-in substrate 10 of the first embodiment.

The second electronic component 76 is constructed similarly to the second electronic component 15 except that an area of the surface 76A is smaller than an area of the surface 15A of the second electronic component 15. A plurality of second electronic components 76 are surface-mounted on the pad portions 56 of the wiring pattern 51 (connected via the bumps 29 that are provided on the electrode pads 63 provided to the second electronic component 76) such that the surfaces 76A are opposed to the surface 14A of the first electronic component 14. A plurality of second electronic components 76 are constructed such that a total area of the surfaces 76A of plural second electronic components 76 is set substantially equal to an area of the surface 14A of the first electronic component 14.

The electronic component built-in substrate 75 according to the second variation of the first embodiment constructed as above can achieve the similar advantages to those in the electronic component built-in substrate 10 of the first embodiment. Here, in the electronic component built-in substrate 75 according to the second variation of the first embodiment, the first underfill resin 71 shown in FIG. 10 may be provided between the first electronic component 14 and the first wiring substrate 11 or the second underfill resin 72 shown in FIG. 10 may be provided between a plurality of second electronic components 76 and the second wiring substrate 12.

Figure 11:
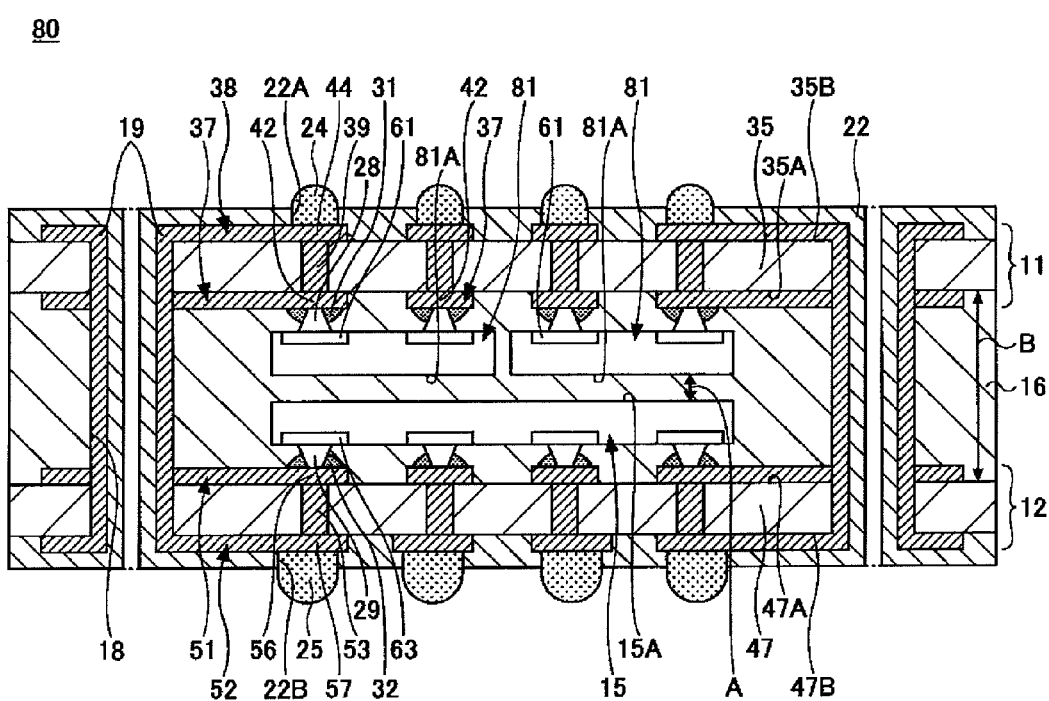
FIG. 11 is a sectional view of an electronic component built-in substrate according to a third variation of the first embodiment of the present invention.

FIG. 11 is a sectional view of an electronic component built-in substrate according to a third variation of the first embodiment of the present invention. In FIG. 11, the same symbols are affixed to the same constituent portions as those in the electronic component built-in substrate 10 of the first embodiment.

By reference to FIG. 11, an electronic component built-in substrate 80 according to a third variation of the first embodiment is constructed similarly to the electronic component built-in substrate 10 except that a plurality of first electronic components 81, an area of a surface 81A of each of which opposing to the surface 15A of the second electronic component 15 is smaller than an area of the surface 15A of the second electronic component 15, are provided instead of the first electronic component 14 being provided to the electronic component built-in substrate 10 of the first embodiment.

The first electronic component 81 is constructed similarly to the first electronic component 14 except that an area of the surface 81A is smaller than an area of the surface 14A of the first electronic component 14. A plurality of first electronic components 81 are surface-mounted on the pad portions 42 of the wiring pattern 37 (connected via the bumps 28 that are provided on the electrode pads 61 provided to the first electronic components 81) such that the surfaces 81A are opposed to the surface 15A of the second electronic component 15. A plurality of first electronic components 81 are constructed such that a total area of the surfaces 81A of plural first electronic components 81 is set substantially equal to an area of the surface 15A of the second electronic component 15.

The electronic component built-in substrate 80 according to the third variation of the first embodiment constructed as above can achieve the similar advantages to those in the electronic component built-in substrate 10 of the first embodiment. Here, in the electronic component built-in substrate 80 according to the third variation of the first embodiment, the first underfill resin 71 shown in FIG. 10 may be provided between a plurality of first electronic components 81 and the first wiring substrate 11 or the second underfill resin 72 shown in FIG. 10 may be provided between the second electronic component 15 and the second wiring substrate 12.

FIG. 12 to FIG. 22 are views showing steps of manufacturing the electronic component built-in substrate 10 according to the first embodiment of the present invention. In FIG. 12 to FIG. 22, the same symbols are affixed to the same constituent portions as those in the electronic component built-in substrate 10 of the first embodiment.

By reference to FIG. 12 to FIG. 22, a method of manufacturing the electronic component built-in substrate 10 according to the first embodiment will be explained hereunder. At first, in steps shown in FIG. 12, the first wiring substrate 11 including the wiring substrate main body 35 as the first wiring substrate main body, the wiring patterns 37 as the first wiring patterns, the wiring patterns 38 as the third wiring patterns, and the wiring patterns 39 is formed by the well-known approach (e.g., the build-up method) (first wiring substrate forming step). As the wiring substrate main body 35, for example, the resin layer, the coreless substrate (multilayer wiring structure having a plurality of stacked resin layers and wiring patterns provided on a plurality of resin layers), the build-up substrate with core (substrate constructed by forming on a plurality of resin layers and wiring patterns on a core substrate), etc. may be employed.

Figure 13:
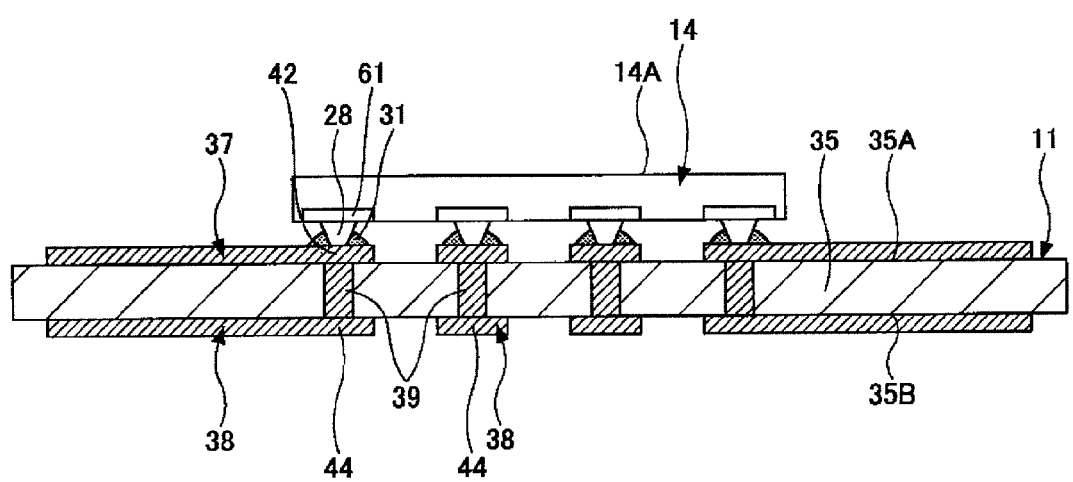

Then, in steps shown in FIG. 13, the first electronic component 14 is surface-mounted on the pad portions 42 (first electronic component mounting step). Concretely, the fused solders 31 are prepared on the pad portions 42 respectively, and then the bump 28 is secured onto the pad portions 42 respectively by pushing the bumps 28 provided on the electrode pads 61 of the first electronic component 14 against the fused solders 31.

Figure 14:
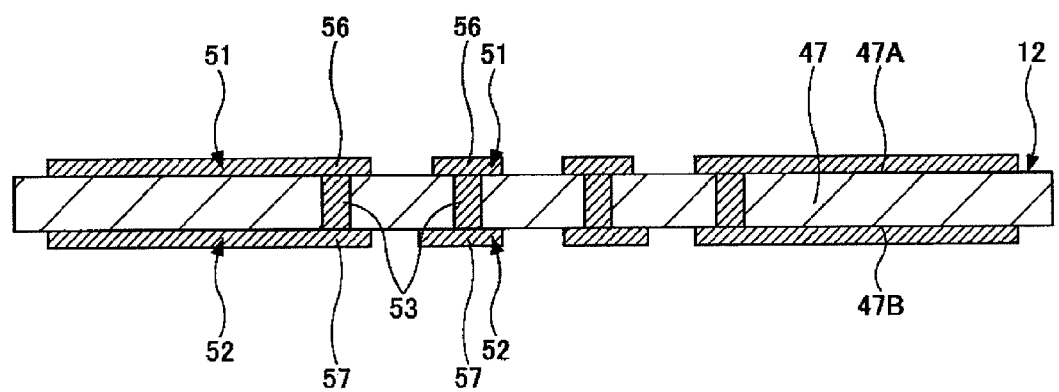

Then, in steps shown in FIG. 14, the second wiring substrate 12 including the wiring substrate main body 47 as the second wiring substrate main body, the wiring patterns 51 as the second wiring patterns, the wiring patterns 52 as the fourth wiring patterns, and the wiring patterns 53 is formed by the well-known approach (e.g., the build-up method) (second wiring substrate forming step). As the wiring substrate main body 47, for example, the resin layer, the coreless substrate (the multilayer wiring structure having a plurality of stacked resin layers and wiring patterns provided on a plurality of resin layers), the build-up substrate with core (substrate constructed by forming on a plurality of resin layers and wiring patterns on a core substrate), etc. may be employed.

Figure 15:
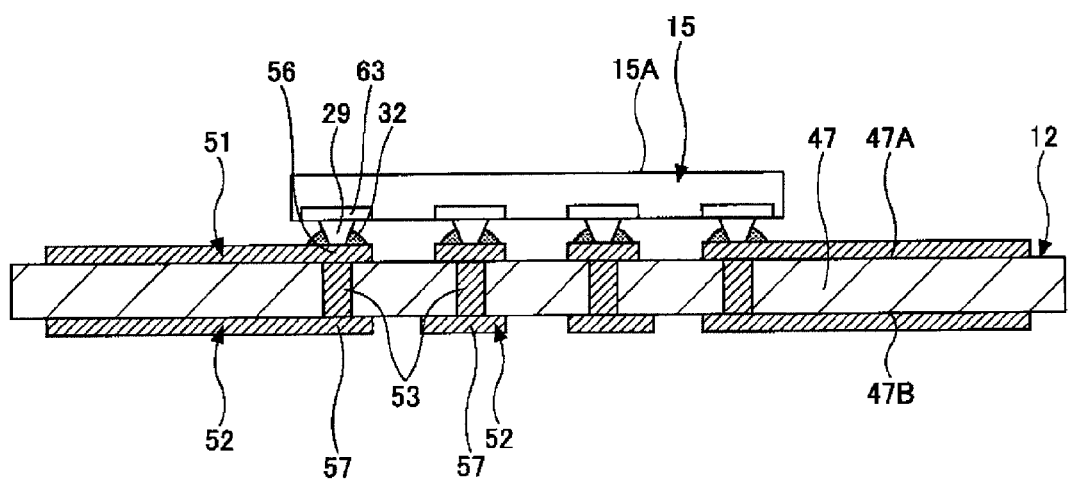

Then, in steps shown in FIG. 15, the second electronic component 15 is surface-mounted on the pad portions 56 (second electronic component mounting step). Concretely, the fused solders 32 are prepared on the pad portions 56 respectively, and then the bump 29 is secured onto the pad portions 56 respectively by pushing the bumps 29 provided on the electrode pads 63 of the second electronic component 15 against the fused solders 32.

Figure 16:
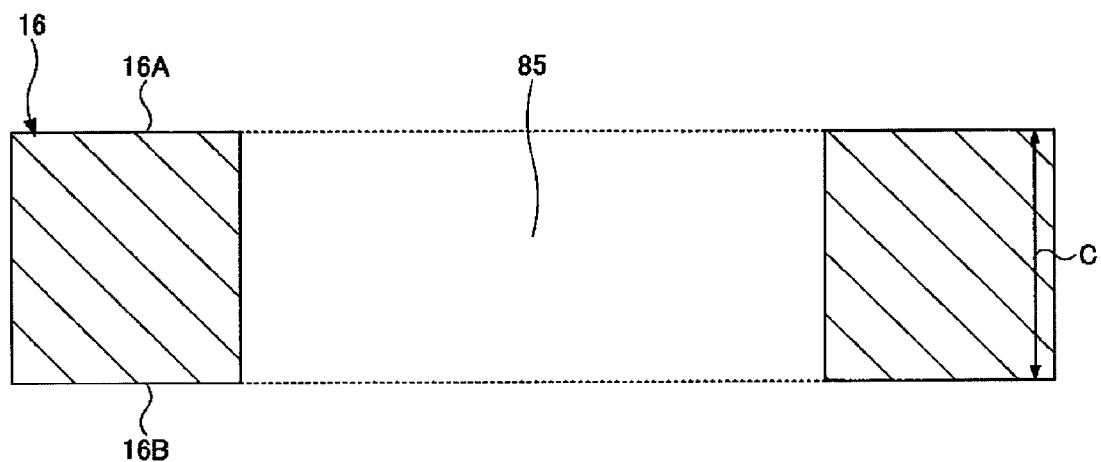

Then, in steps shown in FIG. 16, the resin member 16 which is shaped into a plate, in which the first through portion 85 in which the first and second electronic components 14, 15 are contained is formed, and which is kept in a semi-cured state is formed (resin member forming step). As the base material of the resin member 16, for example, the prepreg resin which is kept in a semi-cured state (concretely, the insulating material made of the glass fiber that is impregnated with a resin, for example) can be employed. The first through portion 85 can be formed by the die cutting process, for example. The resin member 16 that is kept in a semi-cured state is thicker than the thickness B of the resin member 16 that is cured completely shown in FIG. 8. A thickness C of the resin member 16 that is kept in a semi-cured state can be set to 600 μm, for example.

Figure 17:
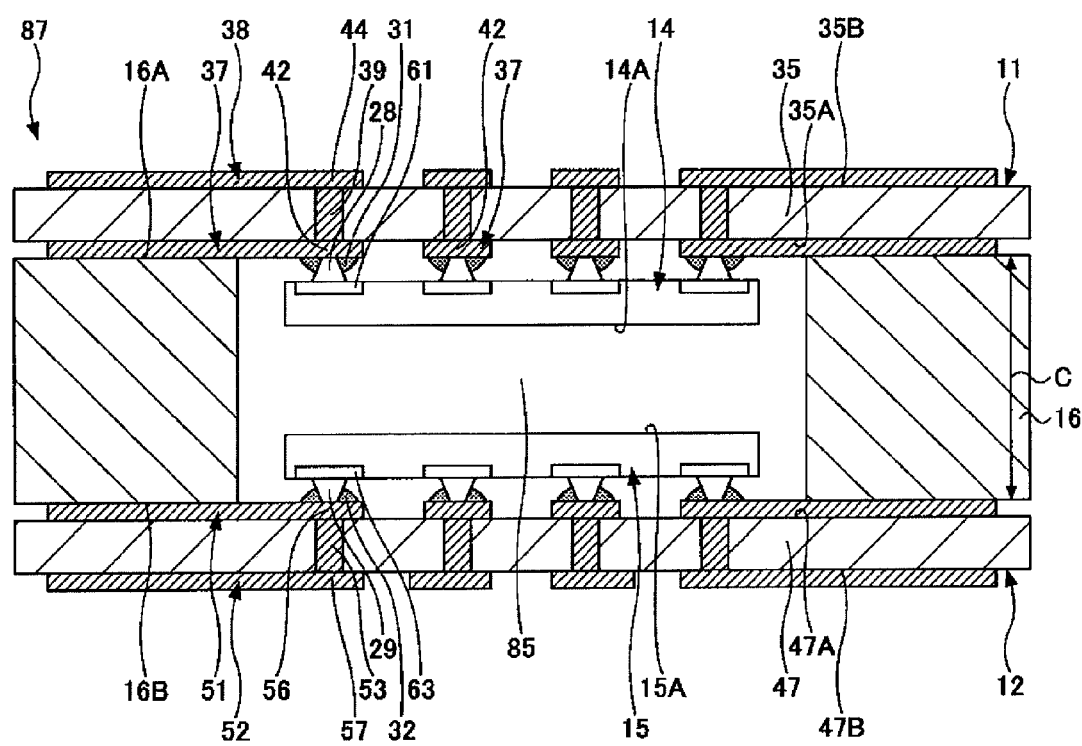

Then, in steps shown in FIG. 17, the first electronic component 14 being surface-mounted on the first wiring substrate 11 is inserted from the upper surface 16A side of the resin member 16 that is kept in a semi-cured state into the first through portion 85 and the second electronic component 15 being surface-mounted on the second wiring substrate 12 is inserted from the lower surface 16B side of the resin member 16 that is kept in a semi-cured state into the first through portion 85 such that the first electronic component 14 and the second electronic component 15 are arranged oppositely, so that such a stacked body 87 is formed that the first wiring substrate 11 on which the first electronic component 14 is surface-mounted, the resin member 16 that is kept in a semi-cured state, and the second wiring substrate 12 on which the second electronic component 15 is surface-mounted are stacked (stacked body forming step).

At this time, the first wiring substrate 11 comes in touch with the upper surface 16A of the resin member 16, and the second wiring substrate 12 comes in touch with the lower surface 16B of the resin member 16. Also, a clearance that is larger than the clearance A shown in FIG. 8 is formed between the first electronic component 14 being inserted into the first through portion 85 and the second electronic component 15 being inserted into the first through portion 85.

Figure 18:
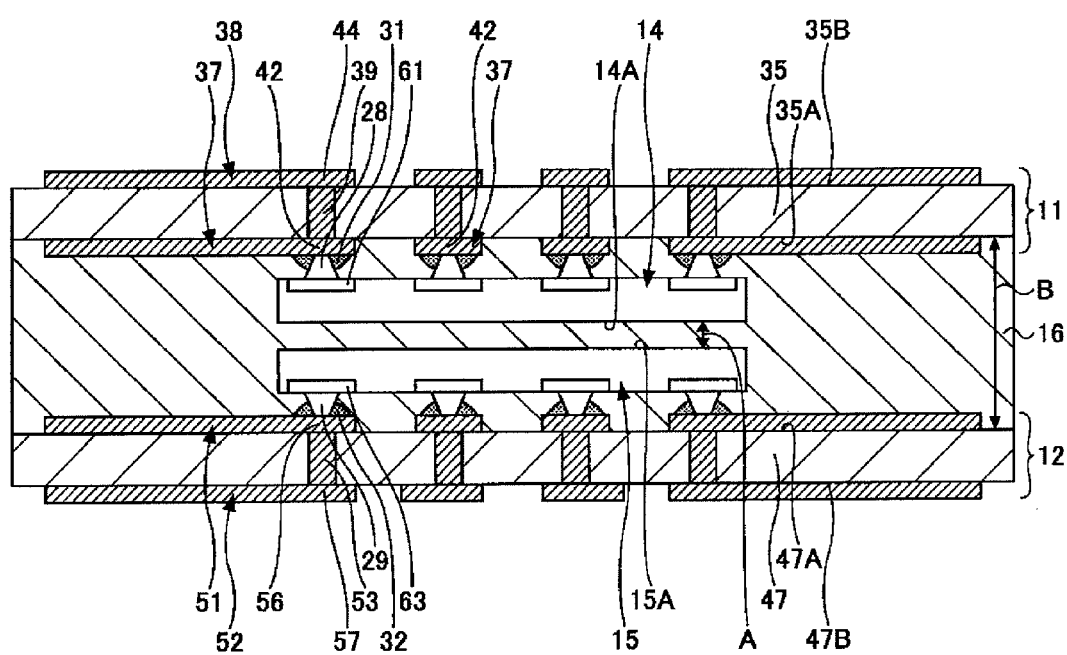

Then, in steps shown in FIG. 18, the resin member 16 that is kept in a semi-cured state and shown in FIG. 17 is cured completely by pressing the stacked body that is in a heated state, and then the space between the first wiring substrate 11 on which the first electronic component 14 is surface-mounted and the second wiring substrate 12 on which the second electronic component 15 is surface-mounted is sealed with the completely cured resin member 16 (sealing step).

When the base material of the resin member 16 that is kept in a semi-cured state is formed of the prepreg resin, only the resin constituting the prepreg resin is filled in the clearance between the first electronic component 14 and the first wiring substrate 11, the clearance between the second electronic component 15 and the second wiring substrate 12, and the clearance A between the first electronic component 14 and the second electronic component 15 in the sealing step.

In this manner, the first electronic component 14 surface-mounted on the first wiring substrate 11 and the second electronic component 15 surface-mounted on the second wiring substrate 12 are inserted into the first through portion 85 in the resin member 16 that is kept in a semi-cured state in such a manner that the first electronic component 14 and the second electronic component 15 are arranged to oppose to each other. Therefore, such a stacked body 87 is formed that the first wiring substrate 11 on which the first electronic component 14 is surface-mounted, the resin member 16 that is kept in a semi-cured state, and the second wiring substrate 12 on which the second electronic component 15 is surface-mounted are stacked. Then, the resin member 16 that is kept in a semi-cured state is completely cured by pressing the stacked body 87 that is in a heated state in such a way that the space between the first wiring substrate 11 on which the first electronic component 14 is surface-mounted and the second wiring substrate 12 on which the second electronic component 15 is surface-mounted is sealed with the cured resin member 16. As a result, a size of the electronic component built-in substrate 10 in the thickness direction can be reduced rather than the related-art electronic component built-in substrate 200 in which the electronic components 211, 214 being mounted on both surfaces 201A, 201B of the core substrate 201 are built.

Also, the resin member 16 that is kept in a semi-cured state is fully cured by the heating in such a state that the first wiring substrate 11, on which the first electronic component 14 is surface-mounted, is arranged on the surface 16A of the resin member 16 that is kept in a semi-cured state and also the second wiring substrate 12, on which the second electronic component 15 is surface-mounted, is arranged on the surface 16B of the resin member 16 that is kept in a semi-cured state (a state that the structures having the similar configuration respectively are arranged on both surfaces 16A, 16B of the resin member 16 that is kept in a semi-cured state) such that the space between the first wiring substrate 11 on which the first electronic component 14 is surface-mounted and the second wiring substrate 12 on which the second electronic component 15 is surface-mounted is sealed. As a result, occurrence of a warp of the structure shown in FIG. 18 (the electronic component built-in substrate 10 in the course of manufacture) can be eliminated, and thus occurrence of a warp of the electronic component built-in substrate 10 can be prevented.

Figure 19:
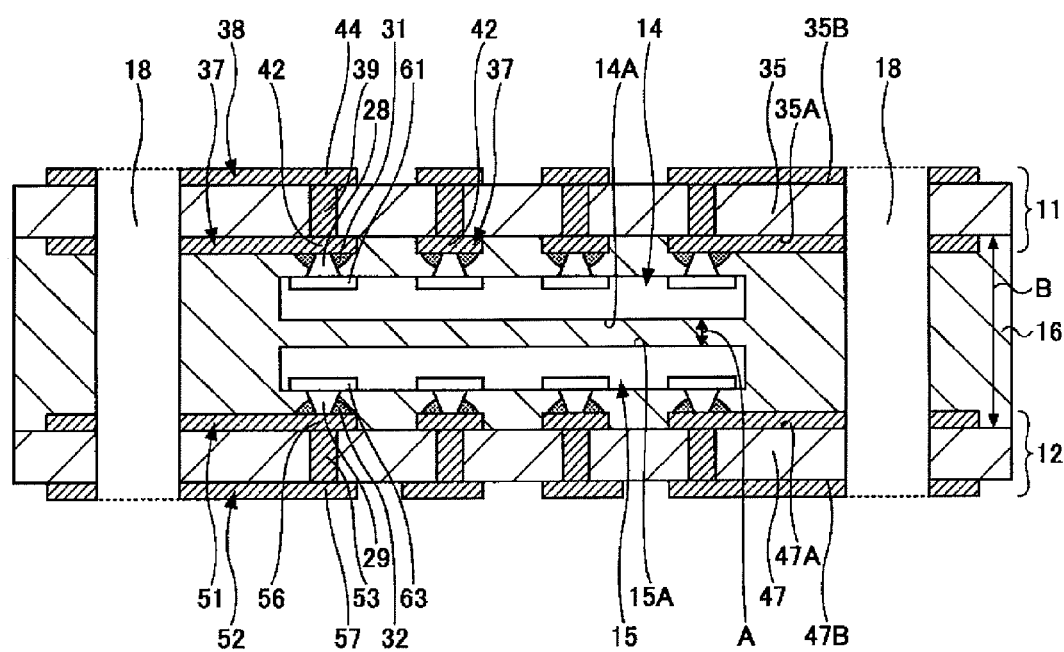

Then, in steps shown in FIG. 19, the through holes 18 that pass through the first wiring substrate 11, the resin member 16, and the second wiring substrate 12 are formed. The through holes 18 are formed by the NC drill, for example.

Figure 20:
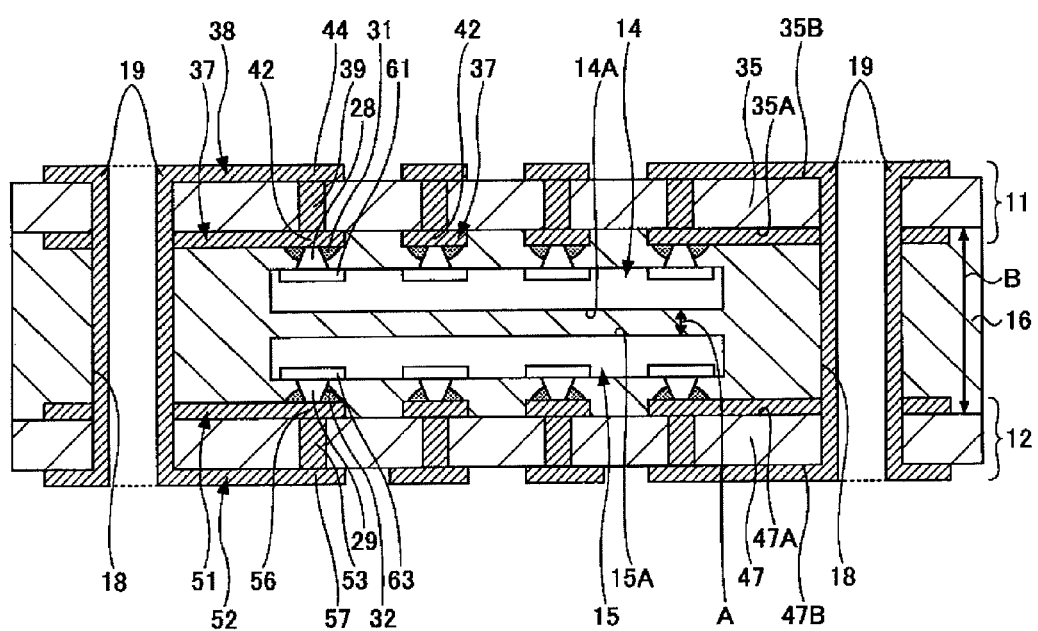

Then, in steps shown in FIG. 20, the through electrode 19 is formed on the side surfaces of the through holes 18 by the plating method. At this time, a hollow portion is formed in the through electrode 19. In other words, the through electrode 19 that is shaped like a cylinder is formed.

Figure 21:
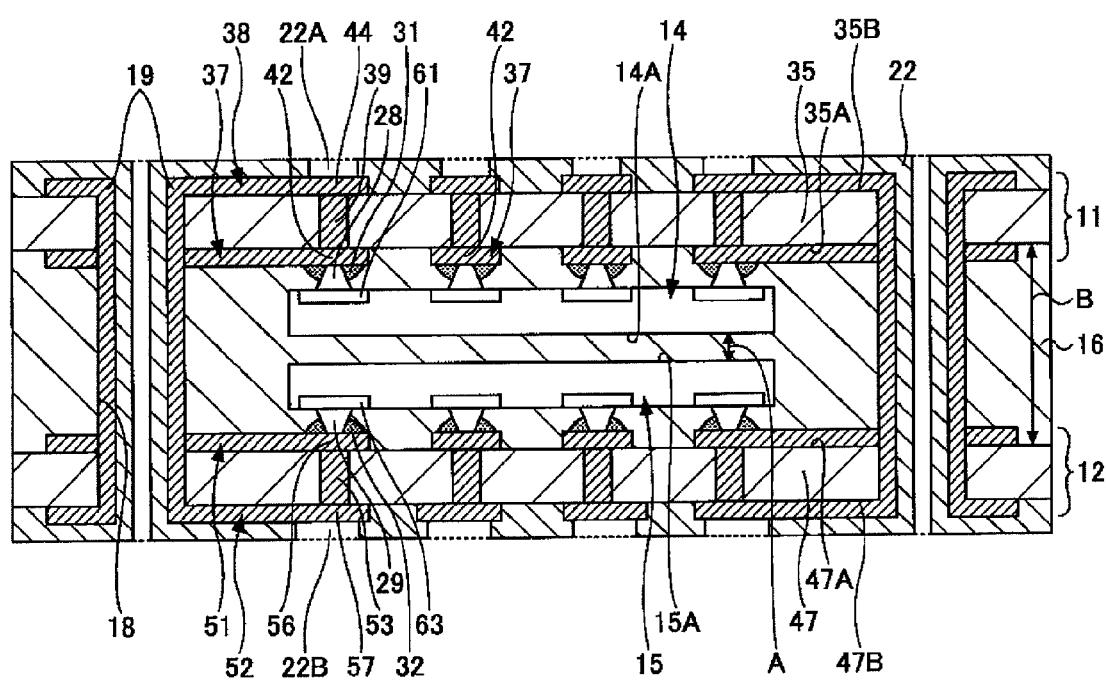

Then, in steps shown in FIG. 21, the solder resist layer 22 is formed to cover the surfaces 35B, 47B of the wiring substrate main bodies 35, 47, the portion of the wiring pattern 38 except the pad portions 44, the portion of the wiring pattern 52 except the pad portions 57, and inner walls of the through electrodes 19. Also, the opening portion 22A from which the pad portion 44 is exposed respectively, and the opening portion 22B from which the pad portion 57 is exposed respectively are formed in the solder resist layer 22.

Figure 22:
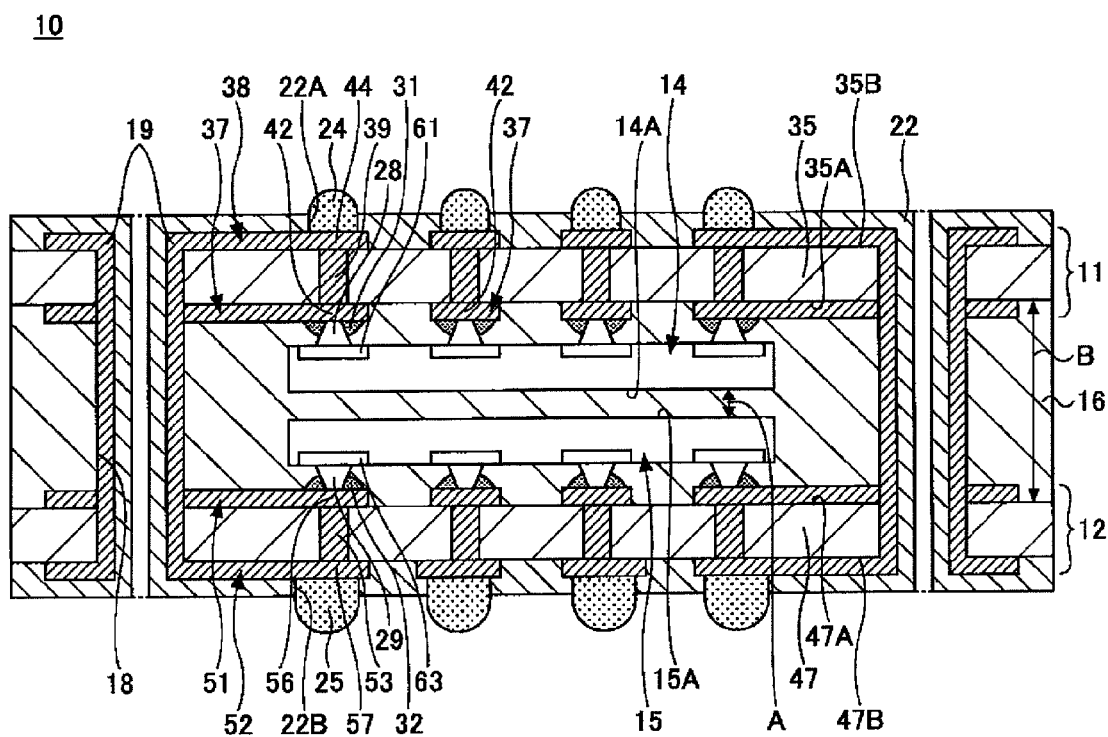

Then, in steps shown in FIG. 22, the first external connection terminal 24 is formed on the portions of the pad portions 44 exposed from the opening portions 22A respectively, and also the second external connection terminal 25 is formed on the portions of the pad portions 57 exposed from the opening portions 22B respectively. Accordingly, the electronic component built-in substrate 10 of the first embodiment is manufactured. As the first external connection terminal 24, for example, the solder bump can be employed. Also, as the second external connection terminal 25, for example, the solder ball can be employed.

According to the electronic component built-in substrate according to the present embodiment, the first wiring substrate 11 having the wiring substrate main body 35 and the wiring patterns 37 being provided on the surface 35A of the wiring substrate main body 35 is formed, then the first electronic component 14 is surface-mounted on the wiring patterns 37, then the second wiring substrate 12 having the wiring substrate main body 47 and the wiring patterns 51 being provided on the surface 47A of the wiring substrate main body 47 is formed, then the second electronic component 15 is surface-mounted on the wiring patterns 51, then the resin member 16 that is shaped like a plate, has the first through portion 85 in which the first and second electronic components 14, 15 are contained, and is kept in a semi-cured state is formed, and then the first electronic component 14 and the second electronic component 15 are arranged to oppose to each other by inserting the first electronic component 14 being surface-mounted on the first wiring substrate 11 and the second electronic component 15 being surface-mounted on the second wiring substrate 12 into the first through portion 85 and therefore the stacked body 87 in which the first wiring substrate 11 on which the first electronic component 14 is surface-mounted, the resin member 16 that is kept in a semi-cured state, and the second wiring substrate 12 on which the second electronic component 15 is surface-mounted are stacked is formed, and then the space between the first wiring substrate 11 on which the first electronic component 14 is surface-mounted and the second wiring substrate 12 on which the second electronic component 15 is surface-mounted is sealed with the cured resin member 16 by pressing the stacked body 87 in a heated state to cure completely the resin member 16 that is kept in a semi-cured state. As a result, a size of the electronic component built-in substrate 10 in the thickness direction can be reduced rather than the related-art electronic component built-in substrate 200 in which the electronic components 211, 214 being mounted on both surfaces 201A, 201B of the core substrate 201 are built.

Also, the resin member 16 that is kept in a semi-cured state is fully cured by the heating in such a state that the first wiring substrate 11, on which the first electronic component 14 is surface-mounted, is arranged on the surface 16A of the resin member 16 that is kept in a semi-cured state and also the second wiring substrate 12, on which the second electronic component 15 is surface-mounted, is arranged on the surface 16B of the resin member 16 that is kept in a semi-cured state (a state that the structures having the similar configuration respectively are arranged on both surfaces 16A, 16B of the resin member 16 that is kept in a semi-cured state) such that the space between the first wiring substrate 11 on which the first electronic component 14 is surface-mounted and the second wiring substrate 12 on which the second electronic component 15 is surface-mounted is sealed. As a result, occurrence of a warp of the structure shown in FIG. 18 (the electronic component built-in substrate 10 in the course of manufacture) can be eliminated, and thus occurrence of a warp of the electronic component built-in substrate 10 can be prevented.

The electronic component built-in substrate 70 according to the first variation of the present embodiment can be manufactured by the similar approaches to those in the electronic component built-in substrate 10 of the present embodiment, except that the step of forming the first underfill resin 71 (first underfill resin forming step) and the step of forming the second underfill resin 72 (second underfill resin forming step) are provided prior to the step explained previously and shown in FIG. 17 (stacked body forming step).

In this manner, the first underfill resin forming step of forming the first underfill resin 71 to fill the clearance between the first electronic component 14 and the first wiring substrate 11 is provided prior to the stacked body forming step, and the second underfill resin forming step of forming the second underfill resin 72 to fill the clearance between the second electronic component 15 and the second wiring substrate 12 is provided between the second electronic component mounting step and the stacked body forming step. As a result, reliability of the electrical connection between the first electronic component 14 and the first wiring substrate 11, and also reliability of the electrical connection between the second electronic component 15 and the second wiring substrate 12 can be improved.

Also, the electronic component built-in substrate 75 according to the second variation of the first embodiment and the electronic component built-in substrate 80 according to the third variation of the first embodiment can be manufactured by the similar approach applied to the electronic component built-in substrate 10 of the first embodiment.

Also, in the electronic component built-in substrates 10, 70, 75, 80 explained above, the case where the clearance A is formed between the first electronic component 14 and the second electronic component 15 is explained by way of example. In this case, the first and second electronic components 14, 15 may be arranged such that the surface 14A of the first electronic component 14 contacts the surface 15A of the second electronic component 15.

Second Embodiment

Figure 23:
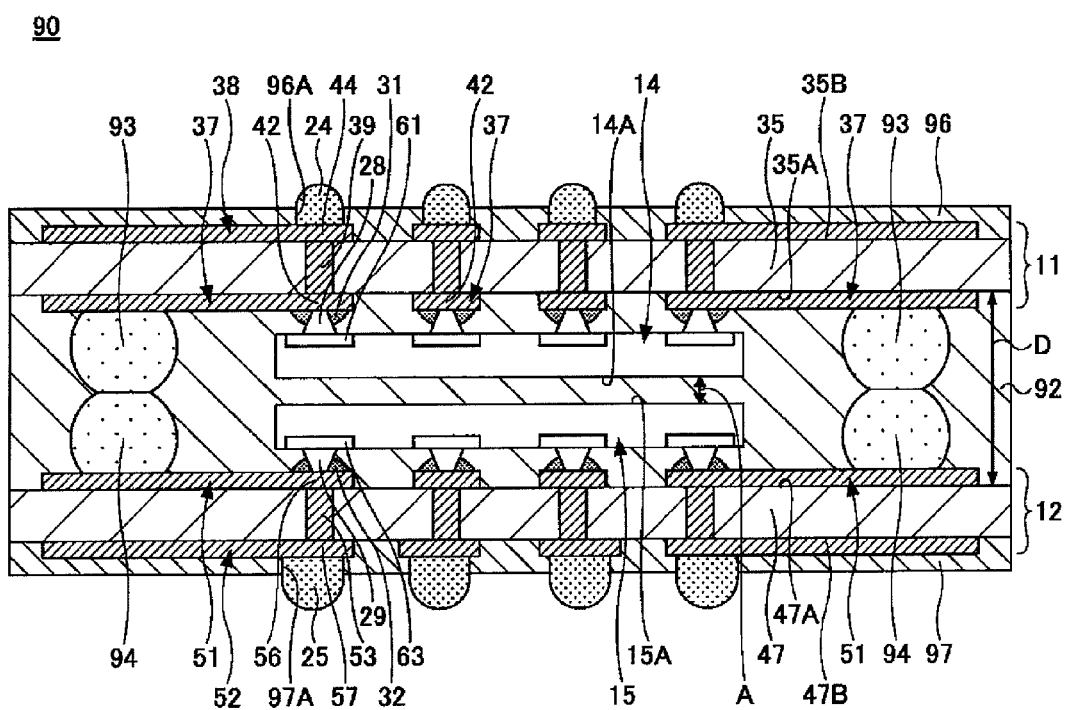
FIG. 23 is a sectional view of an electronic component built-in substrate according to a second embodiment of the present invention.

FIG. 23 is a sectional view of an electronic component built-in substrate according to a second embodiment of the present invention. In FIG. 23, the same symbols are affixed to the same constituent portions as those in the electronic component built-in substrate 10 of the first embodiment.

By reference to FIG. 23, an electronic component built-in substrate 90 according to the second embodiment is constructed similarly to the electronic component built-in substrate 10 except that a resin member 92, first conductive balls 93, second conductive balls 94, solder resist layers 96, 97 are provided instead of the resin member 16, the through hole 18, the through electrode 19 and the solder resist layer 22 being provided to the electronic component built-in substrate 10 of the first embodiment.

The resin member 92 is completely cured, and is provided between the first wiring substrate 11 on which the first electronic component 14 is surface-mounted and the second wiring substrate 12 on which the second electronic component 15 is surface-mounted. The resin member 92 is applied to seal the first and second electronic components 14, 15, and integrate the first wiring substrate 11 on which the first electronic component 14 is surface-mounted with the second wiring substrate 12 on which the second electronic component 15 is surface-mounted. The resin member 92 fills the clearance between the first electronic component 14 and the first wiring substrate 11, the clearance between the second electronic component 15 and the second wiring substrate 12, and the clearance A between the first electronic component 14 and the second electronic component 15. As the base material of the resin member 92, for example, the prepreg resin having the first through portion 85, which is provided to correspond to the area where the first and second electronic components 14, 15 are provided, and second through portions 122 (see FIG. 29), in which the first and second conductive balls 93, 94 are contained, therein can be employed.

In this manner, since the prepreg resin is employed as the base material of the resin member 92, it can be prevented that a warp of the electronic component built-in substrate 90 occurs. A thickness D of the resin member 92 can be set to 300 μm, for example.

The first conductive balls 93 are provided on the wiring patterns 37. The second conductive balls 94 are provided on the wiring patterns 51 to oppose to the first conductive balls 93. The portions of the second conductive balls 94 opposing to the first conductive balls 93 contact the first conductive balls 93. Accordingly, the wiring patterns 37 and the wiring patterns 51 are connected electrically mutually via the first and second conductive balls 93, 94.

In this manner, when the first conductive balls 93 provided on the wiring patterns 37 are brought into contact with the second conductive balls 94 provided on the wiring patterns 51, the wiring patterns 37 and the wiring patterns 51 are connected electrically mutually. As a result, a cost of the electronic component built-in substrate 90 can be reduced in contrast to the case where the wiring patterns 37 and the wiring patterns 51 are connected electrically by the through electrodes 19 being formed by the plating method.

As the first and second conductive balls 93, 94, for example, a solder ball, a solder ball with Cu core having a Cu core and a solder for covering the Cu core, or the like can be employed. When the thickness D of the resin member 92 is set to 300 µm, respective diameters of the first and second conductive balls 93, 94 are set to 200 µm, for example.

The solder resist layer 96 is provided on the surface 35B of the wiring substrate main body 35 to cover the wiring patterns 38 except the portions corresponding to the pad portions 44. The solder resist layer 96 has opening portions 96A from which the pad portion 44 is exposed respectively.

The solder resist layer 97 is provided on the surface 47B of the wiring substrate main body 47 to cover the wiring patterns 52 except the portions corresponding to the pad portions 57. The solder resist layer 96 has opening portions 97A from which the pad portion 57 is exposed respectively.

Figure 24:
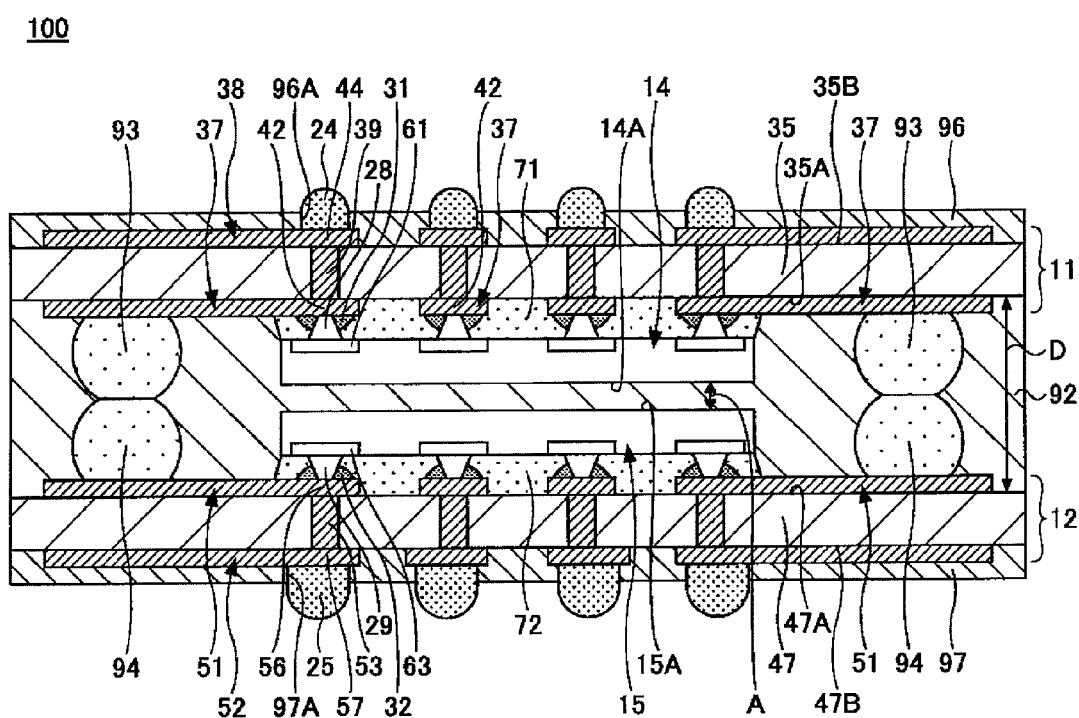
FIG. 24 is a sectional view of an electronic component built-in substrate according to a first variation of the second embodiment of the present invention.

FIG. 24 is a sectional view of an electronic component built-in substrate according to a first variation of the second embodiment of the present invention. In FIG. 24, the same symbols are affixed to the same constituent portions as those in the electronic component built-in substrate 90 of the second embodiment.

By reference to FIG. 24, an electronic component built-in substrate 100 according to the first variation of the second embodiment is constructed similarly to the electronic component built-in substrate 90 except that a first underfill resin 71 for filling a clearance between the first electronic component 14 and the first wiring substrate 11 and also a second underfill resin 72 for filling a clearance between the second electronic component 15 and the second wiring substrate 12 are further provided to the configuration of the electronic component built-in substrate 90 of the second embodiment.

In this manner, the first underfill resin 71 for filling the clearance between the first electronic component 14 and the first wiring substrate 11, and the second underfill resin 72 for filling the clearance between the second electronic component 15 and the second wiring substrate 12 are provided. Therefore, reliability of the electrical connection between the first electronic component 14 and the first wiring substrate 11, and also reliability of the electrical connection between the second electronic component 15 and the second wiring substrate 12 can be improved.

Also, the electronic component built-in substrate 100 according to the first variation of the second embodiment constructed as above can achieve the similar advantages to those in the electronic component built-in substrate 90 of the second embodiment.

Figure 25:
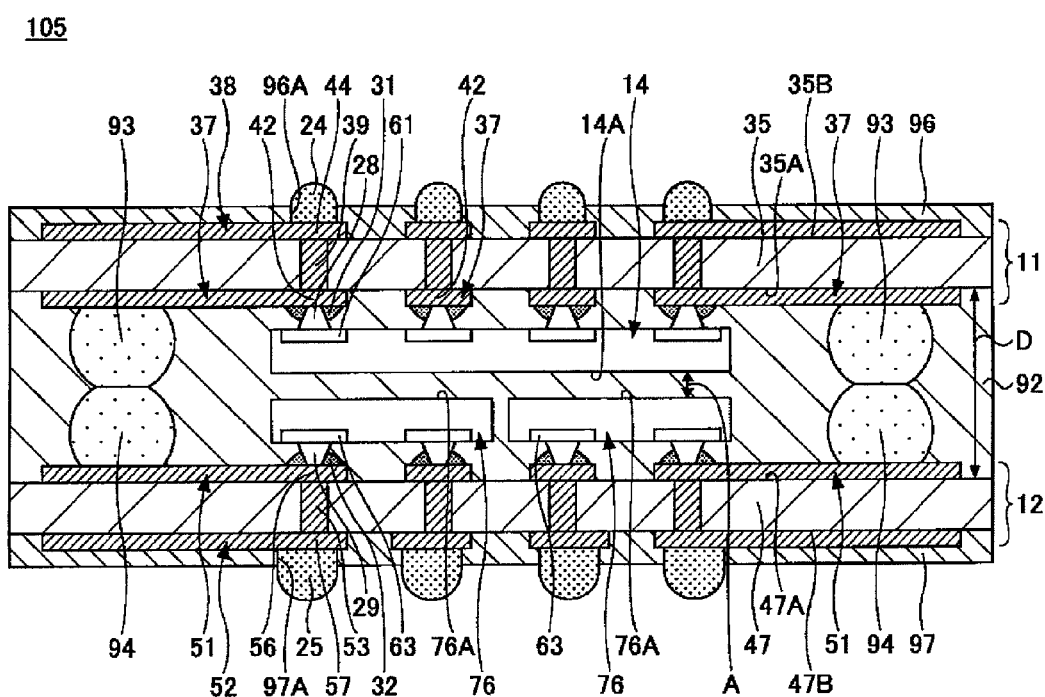
FIG. 25 is a sectional view of an electronic component built-in substrate according to a second variation of the second embodiment of the present invention.

FIG. 25 is a sectional view of an electronic component built-in substrate according to a second variation of the second embodiment of the present invention. In FIG. 25, the same symbols are affixed to the same constituent portions as those in the electronic component built-in substrate 90 of the second embodiment and the electronic component built-in substrate 75 of the second variation of the first embodiment.

By reference to FIG. 25, an electronic component built-in substrate 105 according to a second variation of the second embodiment is constructed similarly to the electronic component built-in substrate 90 except that a plurality of second electronic components 76 being provided to the electronic component built-in substrate 75 of the second variation of the first embodiment are provided instead of the second electronic component 15 being provided to the electronic component built-in substrate 90 of the second embodiment.

The electronic component built-in substrate 105 according to the second variation of the second embodiment constructed as above can achieve the similar advantages to those in the electronic component built-in substrate 90 of the second embodiment.

Figure 26:
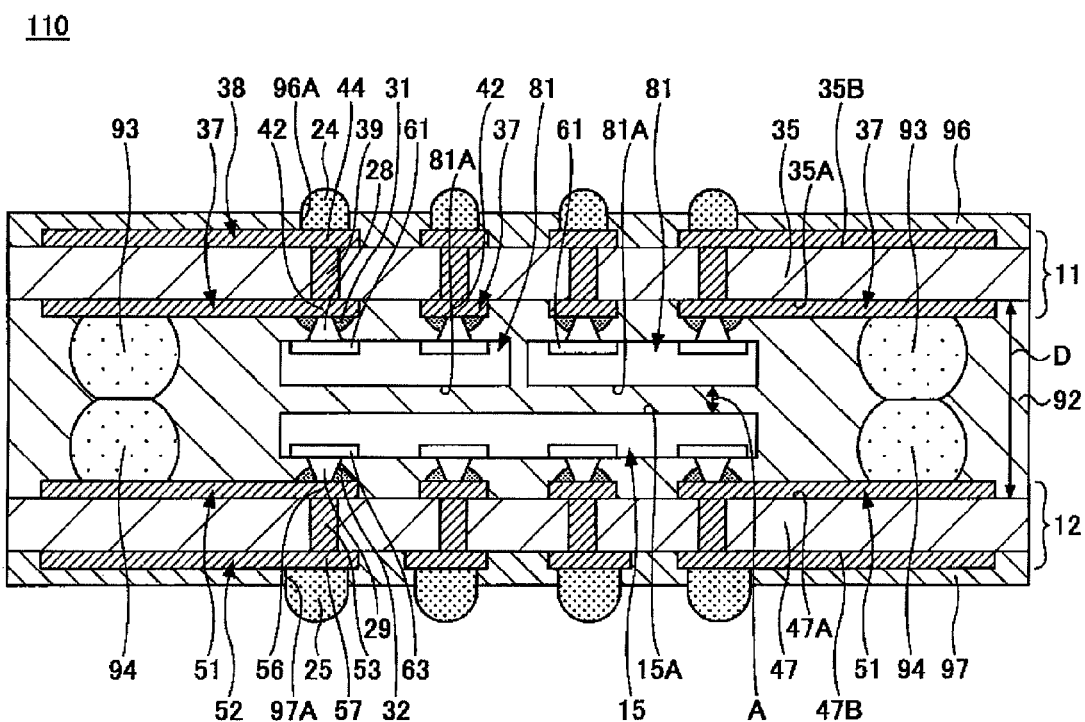
FIG. 26 is a sectional view of an electronic component built-in substrate according to a third variation of the second embodiment of the present invention.
Figure 27:
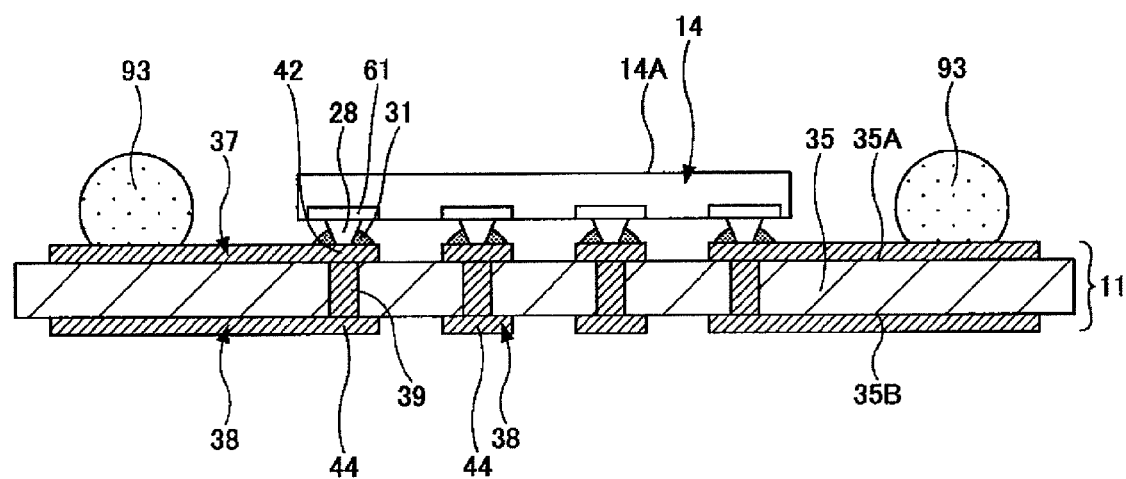
FIG. 27 to FIG. 32 are views showing steps of manufacturing the electronic component built-in substrate according to the second embodiment of the present invention.

FIG. 26 is a sectional view of an electronic component built-in substrate according to a third variation of the second embodiment of the present invention. In FIG. 26, the same symbols are affixed to the same constituent portions as those in the electronic component built-in substrate 90 of the second embodiment and the electronic component built-in substrate 80 of the third variation of the first embodiment.

By reference to FIG. 26, an electronic component built-in substrate 110 according to a third variation of the second embodiment is constructed similarly to the electronic component built-in substrate 90 except that a plurality of first electronic components 81 being provided to the electronic component built-in substrate 80 according to the third variation of the first embodiment are provided instead of the first electronic component 14 being provided to the electronic component built-in substrate 90 of the second embodiment.

The electronic component built-in substrate 110 according to the third variation of the second embodiment constructed as above can achieve the similar advantages to those in the electronic component built-in substrate 90 of the second embodiment.

FIG. 27 to FIG. 32 are views showing steps of manufacturing the electronic component built-in substrate according to the second embodiment of the present invention. In FIG. 27 to FIG. 32, the same symbols are affixed to the same constituent portions as those in the electronic component built-in substrate 90 of the second embodiment.

By reference to FIG. 27 to FIG. 32, a method of manufacturing the electronic component built-in substrate 90 of the second embodiment will be explained hereunder. At first, in steps shown in FIG. 27, the first conductive balls 93 are formed on the wiring patterns 37 (concretely, the wiring patterns 37 except the area where the first electronic component 14 is to be mounted) provided to the structure explained in the first embodiment and shown in FIG. 13. As the first conductive ball 93, for example, a solder ball, a solder ball with Cu core having a Cu core and a solder for covering the Cu core, or the like can be employed. A diameter of the first conductive ball 93 can be set to 200 µm, for example.

Figure 28:
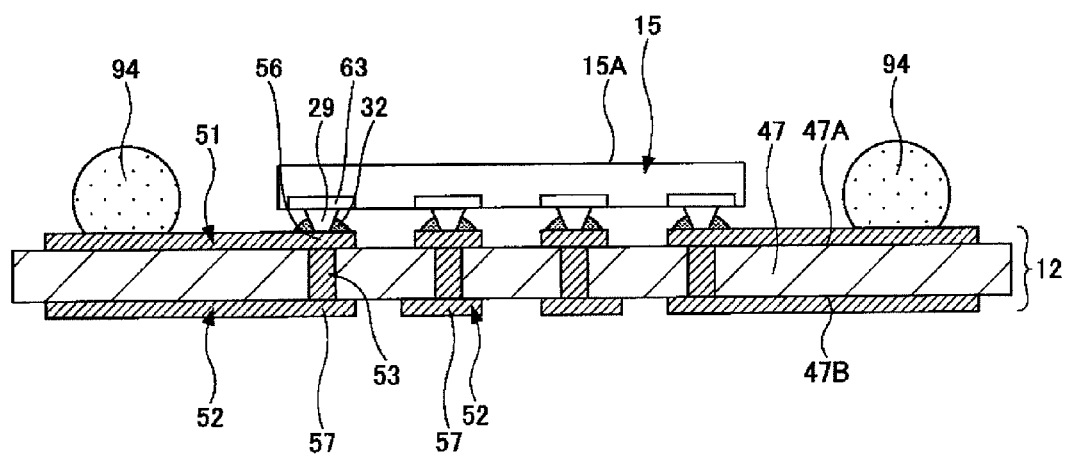

Then, in steps shown in FIG. 28, the second conductive balls 94 are formed on the wiring patterns 51 (concretely, the wiring patterns 51 except the area where the second electronic component 15 is to be mounted) provided to the structure explained in the first embodiment and shown in FIG. 15. As the second conductive ball 94, for example, a solder ball, a solder ball with Cu core having a Cu core and a solder for covering the Cu core, or the like can be employed. A diameter of the second conductive ball 94 can be set to 200 µm for example.

Figure 29:
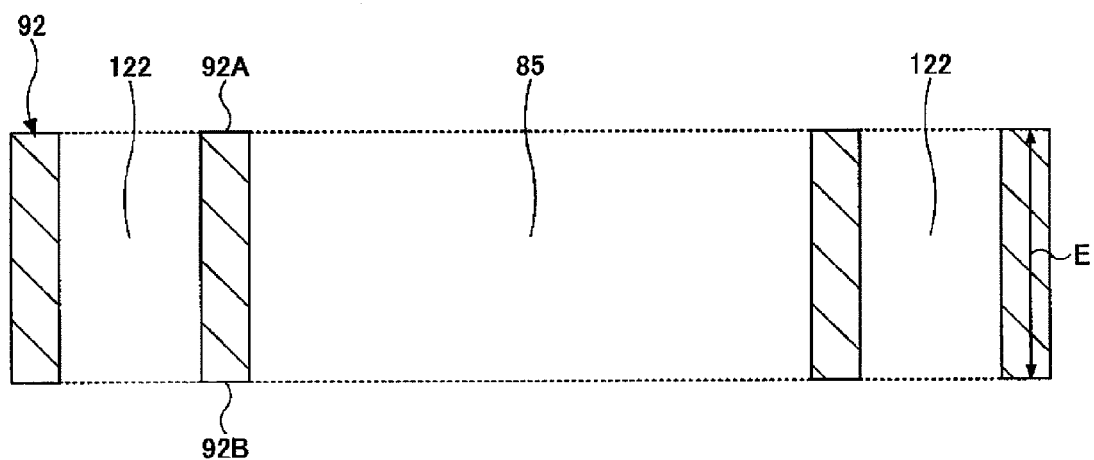

Then, in steps shown in FIG. 29, the resin member 92 that is shaped like a plate, has the first through portion 85 which is provided to correspond to the area where the first and second electronic components 14, 15 and second through portions 122 in which the first and second conductive balls 93, 94 are contained, and is kept in a semi-cured state is formed (resin member forming step). As the base material of the resin member 92, for example, the prepreg resin which is kept in a semi-cured state (concretely, the insulating material made of the glass fiber that is impregnated with a resin, for example) can be employed. The first and second through portions 85, 122 can be formed by the die cutting process, for example. The resin member 92 that is kept in a semi-cured state is thicker than the thickness D of the resin member 92 that is cured completely shown in FIG. 23. A thickness E of the resin member 92 can be set to 600 µm, for example.

Figure 30:
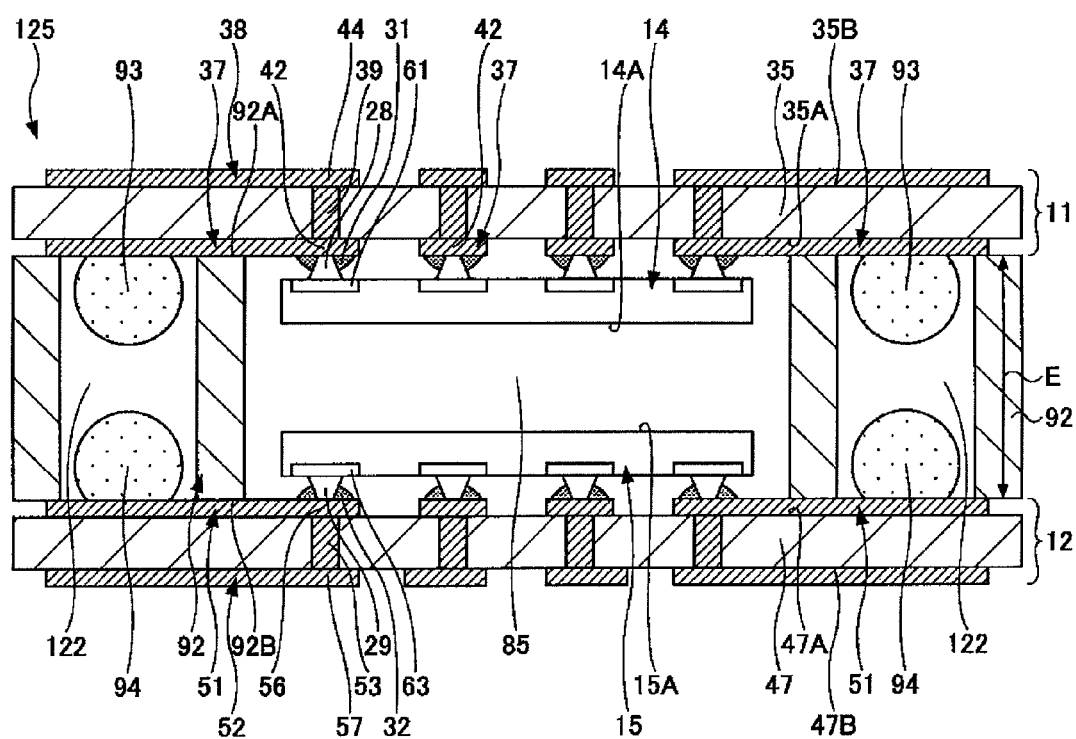

Then, in steps shown in FIG. 30, the first electronic component 14 being surface-mounted on the first wiring substrate 11 is inserted from the upper surface 92A side of the resin member 92 that is kept in a semi-cured state into the first through portion 85, and also the first conductive balls 93 being provided on the first wiring substrate 11 are inserted from the upper surface 92A side of the resin member 92 that is kept in a semi-cured state into the second through portions 122. Then, the second electronic component 15 being surface-mounted on the second wiring substrate 12 is inserted from the lower surface 92B side of the resin member 92 that is kept in a semi-cured state into the first through portion 85, and also the second conductive balls 94 being provided on the second wiring substrate 12 is inserted from the lower surface 92B side of the resin member 92 that is kept in a semi-cured state into the second through portions 122, so that such a stacked body 125 is formed that the second wiring substrate 12 on which the second electronic component 15 and the second conductive balls 94 are provided, the resin member 92 that is kept in a semi-cured state, and the first wiring substrate 11 on which the first electronic component 14 and the first conductive balls 93 are provided are stacked (stacked body forming step).

At this time, the first wiring substrate 11 comes into contact with an upper surface 92A of the resin member 92, and the second wiring substrate 12 comes into contact with a lower surface 92B of the resin member 92. Also, a clearance that is larger than the clearance A shown in FIG. 23 is formed between the first electronic component 14 being inserted into the first through portion 85 and the second electronic component 15 being inserted into the first through portion 85. Also, the first and second conductive balls 93, 94 contained in the second through portions 122 are arranged to oppose to each other at a distance.

Figure 31:
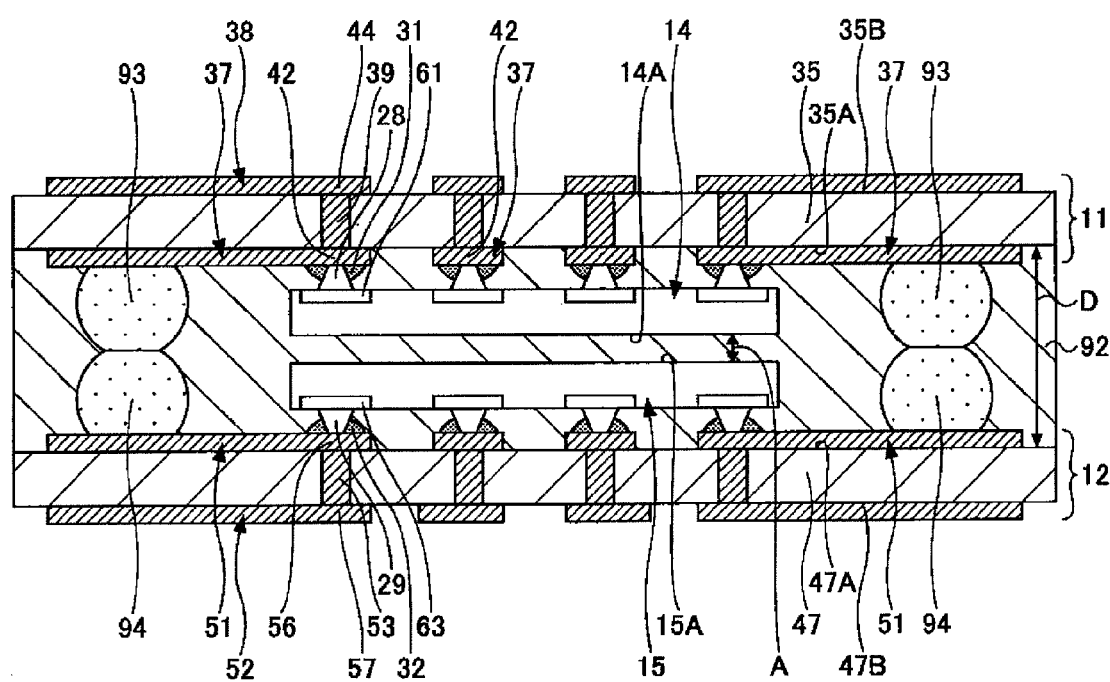

Then, in steps shown in FIG. 31, the stacked body 125 in a heated state is pressed in such a manner that the first conductive balls 93 and the second conductive balls 94 are brought into contact with each other and also the resin member 92 that is kept in a semi-cured state and shown in FIG. 30 is cured completely, so that a space between the first wiring substrate 11, on which the first electronic component 14 and the first conductive balls 93 are provided, and the second wiring substrate 12, on which the second electronic component 15 and the second conductive balls 94 are provided, is sealed by the resin member 92 being cured completely (sealing step).

When the prepreg resin is employed as the base material of the resin member 92 that is kept in a semi-cured state, only the resin constituting the prepreg resin is filled in the clearance between the first electronic component 14 and the first wiring substrate 11, the clearance between the second electronic component 15 and the second wiring substrate 12, and the clearance A between the first electronic component 14 and the second electronic component 15 in the above sealing step.

In this manner, the first electronic component 14 and the second electronic component 15 are arranged oppositely by inserting the first electronic component 14 being surface-mounted on the first wiring substrate 11 and the second electronic component 15 being surface-mounted on the second wiring substrate 12 into the first through portion 85 in the resin member 92 which is kept in a semi-cured state, and also the first conductive balls 93 and the second conductive balls 94 are arranged oppositely by inserting the first conductive balls 93 being provided on the first wiring substrate 11 and the second conductive balls 94 being provided on the second wiring substrate 12 into the second through portions 122 in the resin member 92. Therefore, such a stacked body 125 is formed that the first wiring substrate 11 on which the first electronic component 14 and the first conductive balls 93 are provided, the resin member 92 that is kept in a semi-cured state and has the first and second through portions 85, 122 therein, and the second wiring substrate 12 on which the second electronic component 15 and the second conductive balls 94 are provided are stacked. Then, the stacked body 87 that is in a heated state is pressed in such a manner that the first conductive balls 93 and the second conductive balls 94 are brought into contact with each other and also the resin member 92 that is kept in a semi-cured state is cured completely, so that the space between the first wiring substrate 11 on which the first electronic component 14 and the first conductive balls 93 are provided and the second wiring substrate 12 on which the second electronic component 15 and the second conductive balls 94 are provided is sealed with the cured resin member 92. Therefore, a size of the electronic component built-in substrate 90 in the thickness direction can be reduced rather than the related-art electronic component built-in substrate 200 in which the electronic components 211, 214 being mounted on both surfaces 201A, 201B of the core substrate 201 are built.

Also, the resin member 92 that is kept in a semi-cured state is completely cured by the heating in such a state that the first wiring substrate 11, on which the first electronic component 14 and the first conductive balls 93 are provided, is arranged on the surface 92A of the resin member 92 that is kept in a semi-cured state and also the second wiring substrate 12 on which the second electronic component 15 and the second conductive balls 94 are provided, is arranged on the surface 92B of the resin member 92 that is kept in a semi-cured state (a state that the structures having the similar configuration respectively are arranged on both surfaces 92A, 92B of the resin member 92 that is kept in a semi-cured state) such that the space between the first wiring substrate 11 on which the first electronic component 14 and the first conductive balls 93 are provided and the second wiring substrate 12 on which the second electronic component 15 and the second conductive balls 94 are provided is sealed. Therefore, occurrence of a warp of the electronic component built-in substrate 90 can be prevented.

Also, the stacked body 125 in a heated state is pressed in such a manner that the first conductive balls 93 provided on the first wiring substrate 11 and the second conductive balls 94 provided on the second wiring substrate 12 are brought into contact with each other and thus the first wiring substrate 11 and the second wiring substrate 12 are connected electrically mutually. As a result, a cost of the electronic component built-in substrate 90 can be reduced in contrast to the electronic component built-in substrates 10, 70, 75, 80 in which the first wiring substrate 11 and the second wiring substrate 12 are connected electrically via the through electrodes 19 (see FIG. 8) being formed by the plating method.

Here, the electronic component built-in substrate 100 according to the second variation of the present embodiment can be manufactured by the similar approaches to those in the electronic component built-in substrate 90 of the present embodiment, except that the step of forming the first underfill resin 71 (first underfill resin forming step) and the step of forming the second underfill resin 72 (second underfill resin forming step) are provided prior to the step explained previously and shown in FIG. 30 (stacked body forming step).

In this manner, the first underfill resin forming step of forming the first underfill resin 71 to fill the clearance between the first electronic component 14 and the first wiring substrate 11 is provided prior to the stacked body forming step, and the second underfill resin forming step of forming the second underfill resin 72 to fill the clearance between the second electronic component 15 and the second wiring substrate 12 is provided between the second electronic component mounting step and the stacked body forming step. As a result, reliability of the electrical connection between the first electronic component 14 and the first wiring substrate 11, and also reliability of the electrical connection between the second electronic component 15 and the second wiring substrate 12 can be improved.

Also, the electronic component built-in substrate 105 according to the second variation of the second embodiment and the electronic component built-in substrate 110 according to the third variation of the second embodiment can be manufactured by the similar approach applied to the electronic component built-in substrate 90 of the second embodiment.

Figure 33:
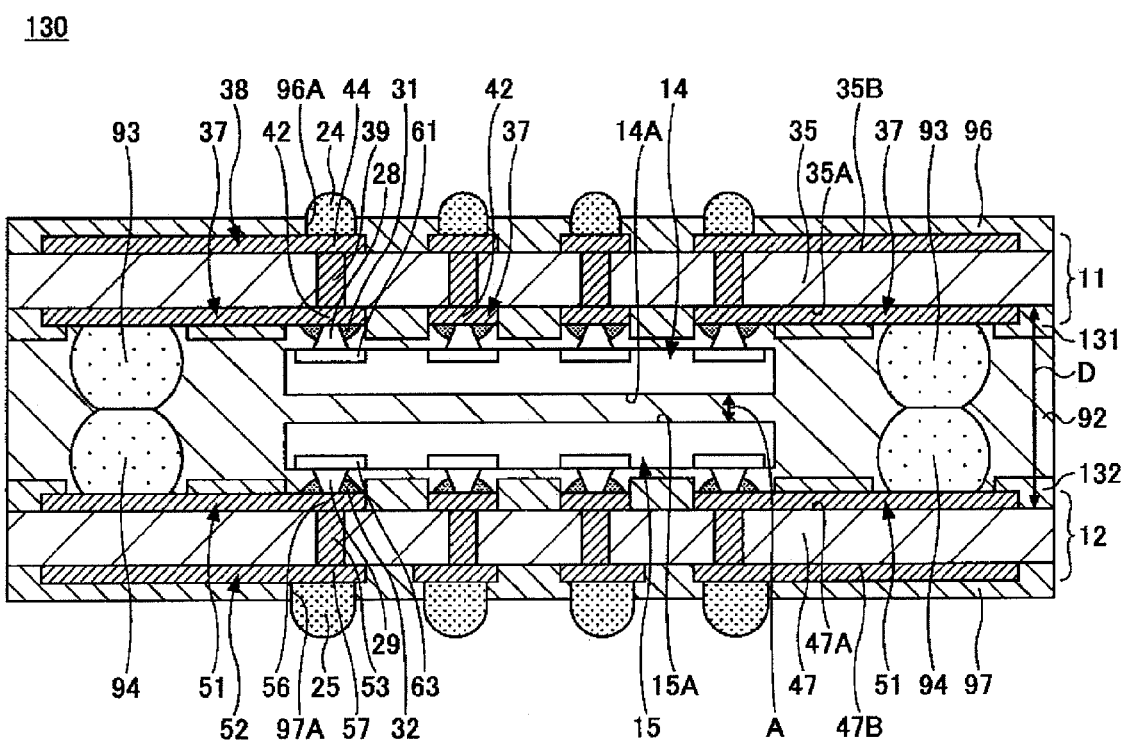
FIG. 33 is a sectional view of an electronic component built-in substrate according to a fourth variation of the second embodiment of the present invention.

FIG. 33 is a sectional view of an electronic component built-in substrate according to a fourth variation of the second embodiment of the present invention. In FIG. 33, the same symbols are affixed to the same constituent portions as those in the electronic component built-in substrate 90 of the second embodiment.

By reference to FIG. 33, an electronic component built-in substrate 130 according to a fourth variation of the second embodiment is constructed similarly to the electronic component built-in substrate 90 except that solder resist layers 131 and 132 is provided to the electronic component built-in substrate 90 of the second embodiment.

The solder resist layer 131 is provided on the first wiring substrate 11. The solder resist layer 131 is provided on the surface 35A of the wiring substrate main body 35 to cover the portions of the wiring patterns 37 except the areas where the pad portions 42 and the first conductive balls 93 are to be provided.

The solder resist layer 132 is provided on the second wiring substrate 12. The solder resist layer 132 is provided on the surface 47A of the wiring substrate main body 47 to cover the portions of the wiring patterns 51 except the areas where the pad portions 56 and the second conductive balls 94 are to be provided.

According to the electronic component built-in substrate 130 according to the fourth variation of the present embodiment, the solder resist layer 131 for covering the portions of the wiring patterns 37 except the areas where the pad portions 42 and the first conductive balls 93 are to be provided is provided on the surface 35A of the wiring substrate main body 35. Therefore, such a situation can be prevented that, when the first conductive balls 93 are joined to the first wiring substrate 11, the adjacent wiring patterns 37 are short-circuited because of the outflow of the fused solder (the solder constituting the first conductive balls 93).

Also, the solder resist layer 132 for covering the portions of the wiring patterns 51 except the areas where the pad portions 56 and the second conductive balls 94 are to be provided is provided on the surface 47A of the wiring substrate main body 47. Therefore, such a situation can be prevented that, when the second conductive balls 94 are joined to the second wiring substrate 12, the adjacent wiring patterns 51 are short-circuited because of the outflow of the fused solder (the solder constituting the second conductive balls 94).

The electronic component built-in substrate 130 according to the fourth variation of the second embodiment constructed as above can achieve the similar advantages to those in the electronic component built-in substrate 90 of the second embodiment.

FIG. 34 to FIG. 37 are views showing steps of manufacturing the electronic component built-in substrate according to the fourth variation of the second embodiment of the present invention. In FIG. 34 to FIG. 37, the same symbols are affixed to the same constituent portions as those in the electronic component built-in substrate 130 of the fourth variation of the second embodiment.

By reference to FIG. 34 to FIG. 37, a method of manufacturing the electronic component built-in substrate 130 of the fourth variation of the second embodiment will be explained hereunder.

Figure 12:
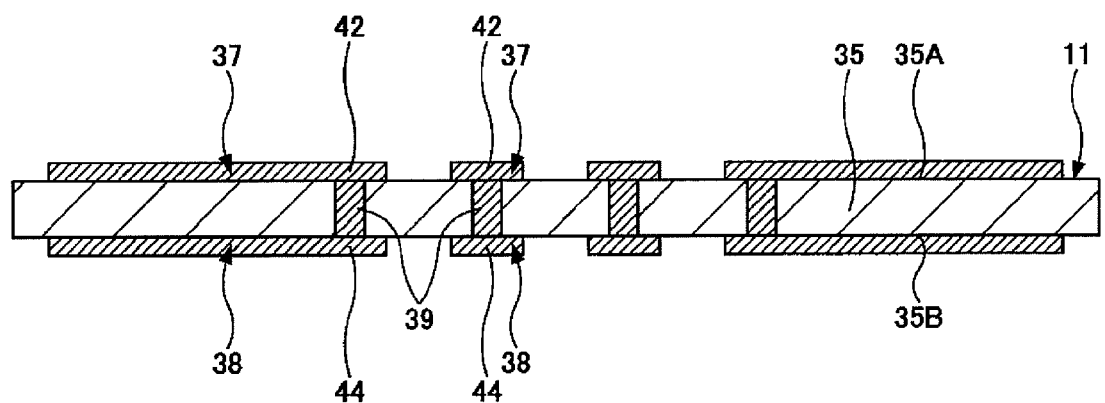
FIG. 12 to FIG. 22 are views showing steps of manufacturing the electronic component built-in substrate according to the first embodiment of the present invention.
Figure 34:
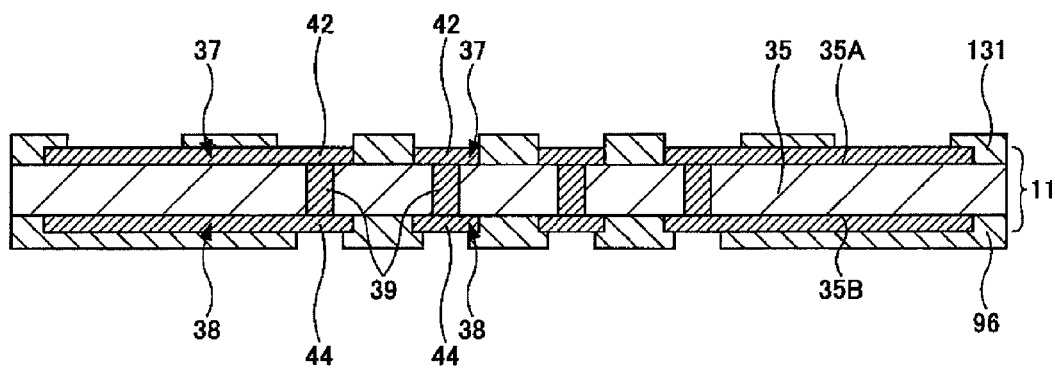
FIG. 34 to FIG. 37 are views showing steps of manufacturing the electronic component built-in substrate according to the fourth variation of the second embodiment of the present invention.

At first, in steps shown in FIG. 34, the first wiring substrate 11 explained in the first embodiment and shown in FIG. 12 is formed. Then, the solder resist layer 131 for covering the portions of the wiring patterns 37 except the areas where the pad portions 42 and the first conductive balls 93 are to be provided is formed on the surface 35A of the wiring substrate main body 35, and also the solder resist layer 96 for covering the portions of the wiring patterns 38 except the pad portions 44 is formed on the surface 35B of the wiring substrate main body 35.

Figure 35:
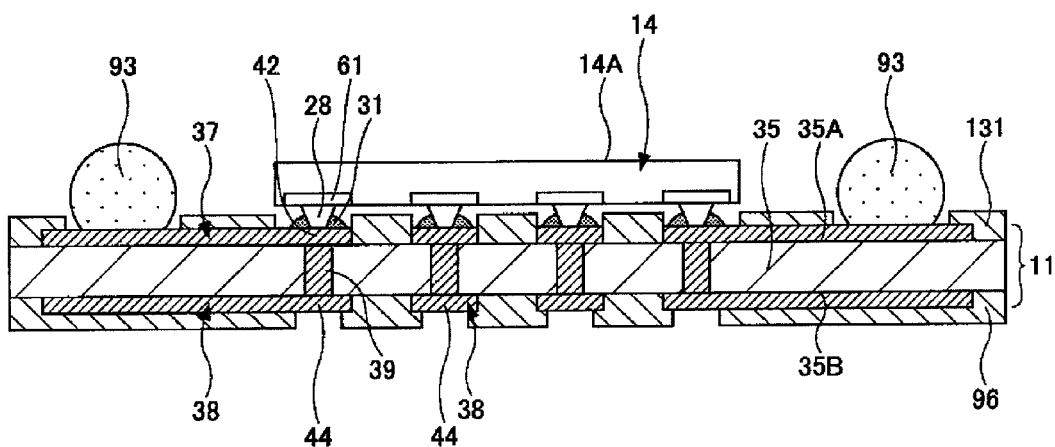

Then, in steps shown in FIG. 35, the first electronic component 14 is surface-mounted on the pad portions 44 (first electronic component mounting step), and then the first conductive balls 93 are formed on the portions of the wiring patterns 37 corresponding to the areas where the first conductive balls 93 are to be provided. In the first electronic component mounting step, for example, the fused solder 31 is prepared on the pad portions 42 respectively, and the bumps 28 provided on the electrode pads 61 of the first electronic component 14 are pushed against the fused solders 31 correspondingly, whereby the bump 28 is fixed onto the pad portions 42 respectively.

In this manner, the solder resist layer 131 for covering the portions of the wiring patterns 37 except the areas where the pad portions 42 and the first conductive balls 93 are to be provided is formed on the surface 35A of the wiring substrate main body 35, then the first electronic component 14 is surface-mounted on the pad portions 42, and then the first conductive balls 93 are formed on the wiring patterns 37 respectively. Therefore, such a situation can be prevented that the adjacent wiring patterns 37 are short-circuited by the fused solder (concretely, the solder 31 and the solder constituting the first conductive balls 93).

Figure 36:
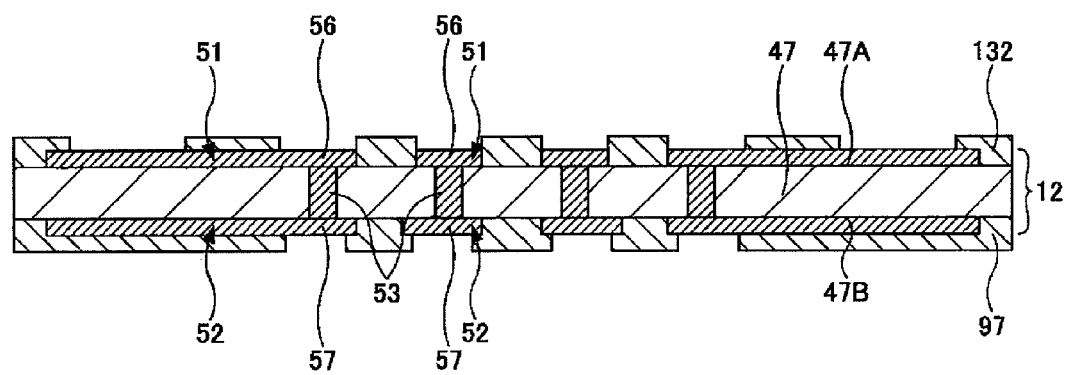

Then, in steps shown in FIG. 36, the second wiring substrate 12 explained in the first embodiment and shown in FIG. 14 is formed. Then, the solder resist layer 132 for covering the portions of the wiring patterns 51 except the areas where the pad portions 56 and the second conductive balls 94 are to be provided is formed on the surface 47A of the wiring substrate main body 47, and also the solder resist layer 97 for covering the portions of the wiring patterns 52 except the pad portions 57 is formed on the surface 47B of the wiring substrate main body 47.

Figure 37:
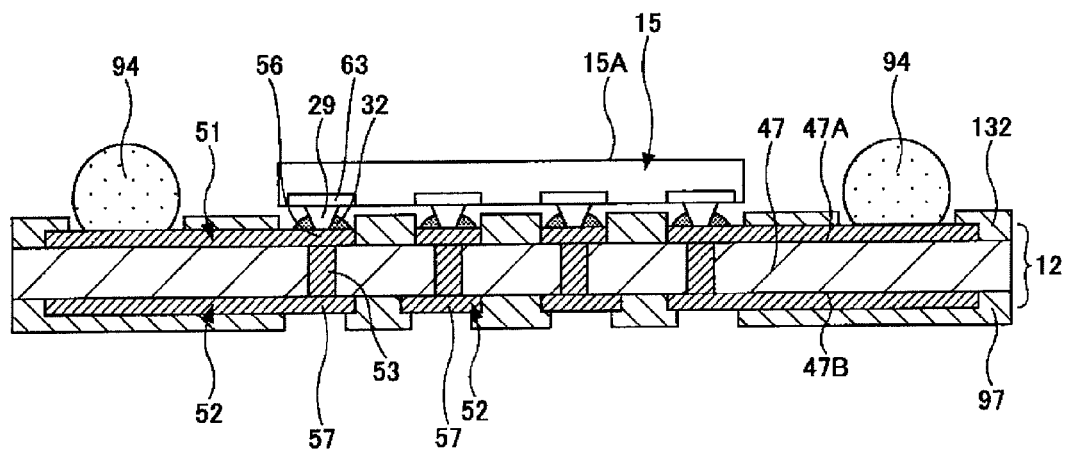

Then, in steps shown in FIG. 37, the second electronic component 15 is surface-mounted on the pad portions 56 (second electronic component mounting step), and then the second conductive balls 94 are formed on the portions of the wiring patterns 51 corresponding to the areas where the second conductive balls 94 are to be provided. In the second electronic component mounting step, for example, the fused solder 32 is prepared on the pad portions 42 respectively, and the bumps 29 provided on the electrode pads 63 of the second electronic component 15 are pushed against the fused solders 32 correspondingly, whereby the bump 29 is fixed onto the pad portions 42 respectively.

In this manner, the solder resist layer 132 for covering the portions of the wiring patterns 51 except the areas where the pad portions 56 and the second conductive balls 94 are to be provided is formed on the surface 47A of the wiring substrate main body 47, then the second electronic component 15 is surface-mounted on the pad portions 56, and then the second conductive balls 94 are formed on the wiring patterns 51 respectively. Therefore, such a situation can be prevented that the adjacent wiring patterns 51 are short-circuited by the fused solder (concretely, the solder 32 and the solder constituting the first conductive balls 94).

Figure 32:
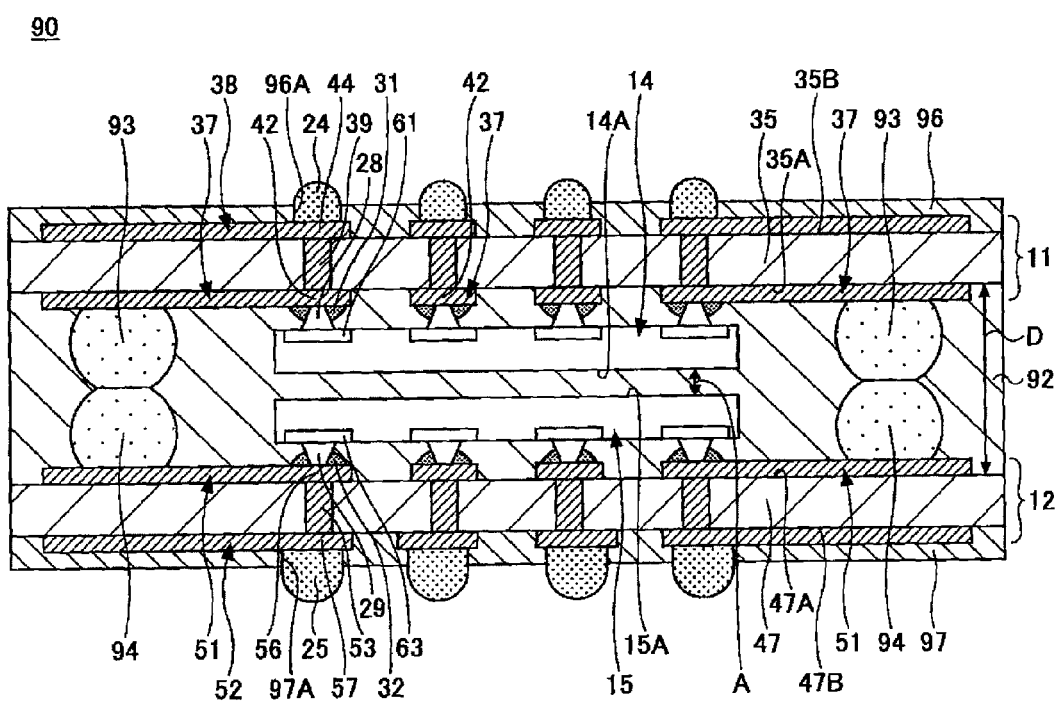

Then, the processes explained in the present embodiment and similar to those in the steps shown in FIG. 30 to FIG. 32 are applied. Thus, the electronic component built-in substrate 130 according to the fourth variation of the present embodiment is manufactured.

According to the method of manufacturing the electronic component built-in substrate according to the fourth variation of the present embodiment, the solder resist layer 131 for covering the portions of the wiring patterns 37 except the areas where the pad portions 42 and the first conductive balls 93 are to be provided is formed on the surface 35A of the wiring substrate main body 35, then the first electronic component 14 is surface-mounted on the pad portions 42, and then the first conductive balls 93 are formed on the wiring patterns 37 respectively. Therefore, such a situation can be prevented that the adjacent wiring patterns 37 are short-circuited by the fused solder (concretely, the solder 31 and the solder constituting the first conductive balls 93).

Also, the solder resist layer 132 for covering the portions of the wiring patterns 51 except the areas where the pad portions 56 and the second conductive balls 94 are to be provided is formed on the surface 47A of the wiring substrate main body 47, then the second electronic component 15 is surface-mounted on the pad portions 56, and then the second conductive balls 94 are formed on the wiring patterns 51 respectively. Therefore, such a situation can be prevented that the adjacent wiring patterns 51 are short-circuited by the fused solder (concretely, the solder 32 and the solder constituting the first conductive balls 94).

With the above, the preferred embodiments of the present invention are described in detail, but the present invention is not limited to such particular embodiments. Various variations/modifications can be applied within a scope of a gist of the present invention set forth in claims.

For example, in the electronic component built-in substrates 90, 100, 105, 110, 130 explained above, the case where the clearance A is formed between the first electronic component 14 and the second electronic component 15 is explained by way of example. In this case, the first and second electronic components 14, 15 may be arranged such that the surface 14A of the first electronic component 14 contacts the surface 15A of the second electronic component 15.

The present invention can be applied to the electronic component built-in substrate in which a plurality of electronic components are built and the method of manufacturing the same.

What is claimed is:

1. An electronic component built-in substrate, comprising:
a first wiring substrate having a first wiring substrate main body and a first wiring pattern provided on a first surface of the first wiring substrate main body;
a first electronic component surface-mounted on the first wiring pattern via flip-chip connection with bumps;
a second wiring substrate having a second wiring substrate main body and a second wiring pattern provided on a first surface of the second wiring substrate main body, the second wiring substrate being arranged under the first wiring substrate such that the first surface of the first wiring substrate main body opposes to the first surface of the second wiring substrate main body;
a second electronic component surface-mounted on the second wiring pattern via flip-chip connection with bumps, and arranged to oppose to the first electronic component;
an insulating material made of a glass fiber impregnated with resin, located between the first and the second wiring substrates where the first wiring substrate directly opposes the second wiring substrate;
an underfill material made of a resin which does not include a glass fiber, located between the first and the second electronic components, between the first electronic component and the first wiring substrate, and between the second electronic component and the second wiring substrate; and
an electrode that electrically connects the first wiring substrate with the second wiring substrate, the electrode provided in a portion of the insulating material.

2. The electronic component built-in substrate, according to claim 1, wherein, when a surface area of a portion of the first electronic component opposing to the second electronic component is larger than a surface area of a portion of the second electronic component opposing to the first electronic component, a plurality of second electronic components are arranged to oppose to the first electronic component.

3. The electronic component built-in substrate, according to claim 1, wherein, when a surface area of a portion of the second electronic component opposing to the first electronic component is larger than a surface area of a portion of the first electronic component opposing to the second electronic component, a plurality of first electronic components are arranged to oppose to the second electronic component.

4. The electronic component built-in substrate, according to claim 1, wherein the first wiring substrate has a third wiring pattern, to which a first external connection terminal is connected, on a second surface of the first wiring substrate main body being located on an opposite side to the first surface of the first wiring substrate main body,
the second wiring substrate has a fourth wiring pattern, to which a second external connection terminal is connected, on a second surface of the second wiring substrate main body being located on an opposite side to the first surface of the second wiring substrate main body, and
the base material of the insulating material has a second through portion, from which a part of the first wiring pattern and a part of the second wiring pattern are exposed, in a portion in which the first wiring pattern opposes to the second wiring pattern, and
wherein the electrode further comprises:
a first conductive ball which is contained in the second through portion and is provided on a portion of the first wiring pattern corresponding to an area where the second through portion is formed; and
a second conductive ball which is contained in the second through portion and is provided on a portion of the second wiring pattern corresponding to an area where the second through portion is formed,
wherein the first conductive ball and the second conductive ball are brought into contact mutually.

5. The electronic component built-in substrate, according to claim 4, further comprising:
a fifth wiring pattern which connects electrically the first wiring pattern and the third wiring pattern, the fifth wiring pattern being provided on the first wiring substrate main body; and
a sixth wiring pattern which connects electrically the second wiring pattern and the fourth wiring pattern, the sixth wiring pattern bring provided on the second wiring substrate main body.

* * * * *